US 8,855,242 B2

(12) United States Patent
Watanabe et al.

(10) Patent No.: US 8,855,242 B2
(45) Date of Patent: Oct. 7, 2014

(54) DATA RECEIVING CIRCUIT, INFORMATION PROCESSING APPARATUS, A COMPUTER READABLE STORAGE MEDIUM, AND DATA RECEIVING METHOD

(71) Applicant: FUJITSU Limited, Kawasaki (JP)

(72) Inventors: Hiroaki Watanabe, Hamamatsu (JP); Hideyuki Negi, Hamamatsu (JP); Chikahiro Deguchi, Toyohashi (JP); Yutaka Sekino, Toyohashi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/916,089

(22) Filed: Jun. 12, 2013

(65) Prior Publication Data

US 2013/0272454 A1  Oct. 17, 2013

Related U.S. Application Data

(63) Continuation of application No. PCT/JP2010/073046, filed on Dec. 21, 2010.

(51) Int. Cl.
*H04L 7/00* (2006.01)
*G11C 7/22* (2006.01)
*G11C 7/10* (2006.01)

(52) U.S. Cl.
CPC ...... *H04L 7/0016* (2013.01); *G11C 2207/2254* (2013.01); *G11C 7/22* (2013.01); *G11C 7/1093* (2013.01)
USPC .......................................................... 375/316

(58) Field of Classification Search
USPC .......................................................... 375/316
See application file for complete search history.

(56) References Cited

U.S. PATENT DOCUMENTS

| | | | |
|---|---|---|---|
| 6,194,969 B1 * | 2/2001 | Doblar | 331/2 |
| 6,229,363 B1 * | 5/2001 | Eto et al. | 327/158 |
| 6,262,611 B1 * | 7/2001 | Takeuchi | 327/159 |
| 6,430,696 B1 | 8/2002 | Keeth | |

(Continued)

FOREIGN PATENT DOCUMENTS

| | | |
|---|---|---|
| JP | 2001-69127 | 3/2001 |
| JP | 2002-531966 | 9/2002 |
| WO | WO 2008/068851 | 6/2008 |

OTHER PUBLICATIONS i"TN-04-54: High-Speed DRAM Controller Design" by Micron Technical Note, Rev. A4/08 EN, published 2008, Retrieved on Nov. 2, 2013 from http://www.micron.com/search?source=ps&q=TN-04-54-High-Speed%20DRAM%20Controller.*

(Continued)

*Primary Examiner* — Daniel Washburn
*Assistant Examiner* — Berhanu Tadese
(74) *Attorney, Agent, or Firm* — Staas & Halsey LLP

(57) ABSTRACT

A data receiving circuit includes a generating unit that generates multiple clocks with different phases from one another. The data receiving circuit includes multiple acquiring units that acquire data from a received data signal by using different clocks from one another out of the multiple clocks generated by the generating unit. The data receiving circuit includes a determining unit that determines whether the data acquired by the multiple acquiring units are consistent. The data receiving circuit includes a correcting unit that corrects the phases of the multiple clocks in a direction in which data inconsistency does not occur when the determining unit has determined that there is data inconsistent with the other data in the data acquired by the multiple acquiring units.

7 Claims, 16 Drawing Sheets

(56) References Cited

U.S. PATENT DOCUMENTS

| | | | |
|---|---|---|---|
| 7,043,652 B2* | 5/2006 | Matsui | 713/400 |
| 7,135,895 B2* | 11/2006 | Komura | 327/108 |
| 7,460,630 B2* | 12/2008 | Kato et al. | 375/372 |
| 7,474,716 B2* | 1/2009 | Vallet et al. | 375/340 |
| 7,543,172 B2* | 6/2009 | Kizer et al. | 713/401 |
| 8,204,153 B2* | 6/2012 | Yamaguchi et al. | 375/316 |
| 8,537,949 B1* | 9/2013 | Cirit et al. | 375/371 |
| 2003/0026162 A1* | 2/2003 | Matsui | 365/233 |
| 2009/0238017 A1* | 9/2009 | Wakasa | 365/194 |
| 2011/0261915 A1* | 10/2011 | Li | 375/359 |

OTHER PUBLICATIONS

International Search Report mailed Mar. 22, 2011 in corresponding International Application No. PCT/JP2010/073046.

* cited by examiner

FIG.12

| STATE | COMPARISON RESULT OF SAMPLING VALUES SAMPLED BY DATA SAMPLING CIRCUITS A TO G | | | | | | | PHASE CORRECTION AMOUNT |
|---|---|---|---|---|---|---|---|---|
| | A | B | C | D | E | F | G | |
| 0 | ○ | ○ | ○ | SAMPLING CRITERION | ○ | ○ | ○ | NO NEED TO CORRECT |
| 1 | × | ○ | ○ | | ○ | ○ | ○ | +1 |
| 1 | × | × | ○ | | ○ | ○ | ○ | +2 |
| 1 | ○ | ○ | ○ | | ○ | ○ | × | −1 |
| 1 | ○ | ○ | ○ | | ○ | × | × | −2 |
| 2 | OTHER THAN THOSE ABOVE | | | | OTHER THAN THOSE ABOVE | | | EXECUTE INITIAL CORRECTION |

DATA RECEIVING CIRCUIT, INFORMATION PROCESSING APPARATUS, A COMPUTER READABLE STORAGE MEDIUM, AND DATA RECEIVING METHOD

CROSS-REFERENCE TO RELATED APPLICATION

This application is a continuation application of International Application PCT/JP2010/073046, filed on Dec. 21, 2010, and designated the U.S., the entire contents of which are incorporated herein by reference.

FIELD

The embodiments discussed herein are directed to a data receiving circuit, an information processing apparatus, a data receiving program, and a data receiving method.

BACKGROUND

Conventionally, there has been known a technology of receiving a data signal and a clock signal and retrieving information from the data signal in accordance with timing indicated by the received clock signal. As an example of such a technology, a technology for a high-speed data receiving circuit, which retrieves information from a data bus signal (hereinafter, referred to as a DQ signal) with the rising edge and falling edge of a data strobe signal (hereinafter, referred to as a DQS signal) as a trigger, is known.

When having received a DQS signal, the high-speed data receiving circuit delays a phase of the received DQS signal by a predetermined amount from a phase of a DQ signal in order to retrieve data within a valid region (a readable range) of the DQ signal. After that, the high-speed data receiving circuit retrieves information from the DQ signal with the rising edge and falling edge of the phase-delayed DQS signal as a trigger.

Furthermore, to accurately delay the phase of the received DQS signal relative to the phase of the DQ signal, the high-speed data receiving circuit generates a clock as the basis for a phase fluctuation amount, and detects a phase shift between the generated clock and the DQS signal. Then, the high-speed data receiving circuit corrects the phase of the DQS signal on the basis of the detected phase shift and acquires information from the DQ signal.

Patent Literature 1: Japanese National Publication of International Patent Application No. 2002-531966
Patent Literature 2: Domestic Re-publication of PCT International Publication for Patent Application No. 2008-068851

SUMMARY

However, the above-described technology of correcting a phase of a DQS signal according to a phase shift between the DQS signal and a reference clock has a problem that information is not acquired from a DQ signal on the occurrence of different phase fluctuations in a DQ signal and a DQS signal.

Namely, when the high-speed data receiving circuit has received a DQ signal which is a data signal and a DQS signal which is a clock signal, the high-speed data receiving circuit corrects a phase of the DQS signal on the basis of a phase shift between a clock as the basis for a phase fluctuation amount and the received DQS signal. Therefore, when different phase fluctuations have occurred in the DQ signal and the DQS signal, the high-speed data receiving circuit makes a wrong correction on the phase of the DQS signal.

As a result, when different phase fluctuations have occurred in the DQ signal and the DQS signal, the high-speed data receiving circuit causes data corruption, etc. and fails to properly acquire information from the DQ signal. That is, on the occurrence of different phase fluctuations in a data signal and a clock signal, the high-speed data receiving circuit does not acquire information from the data signal.

According to an aspect of an embodiment, a data receiving circuit includes a generating unit that generates multiple clocks with different phases from one another. The data receiving circuit includes multiple acquiring units that acquire data from a received data signal by using different clocks from one another out of the multiple clocks generated by the generating unit. The data receiving circuit includes a determining unit that determines whether the data acquired by the multiple acquiring units are consistent. The data receiving circuit includes a correcting unit that corrects the phases of the multiple clocks in a direction in which data inconsistency does not occur when the determining unit has determined that there is data inconsistent with another data in the data acquired by the multiple acquiring units.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 is a diagram for explaining a phase correction amount.

DESCRIPTION OF EMBODIMENTS

A data receiving circuit, an information processing apparatus, a data receiving program, and a data receiving method according to the present application will be explained below with reference to accompanying drawings.

First Embodiment

Figure 1:
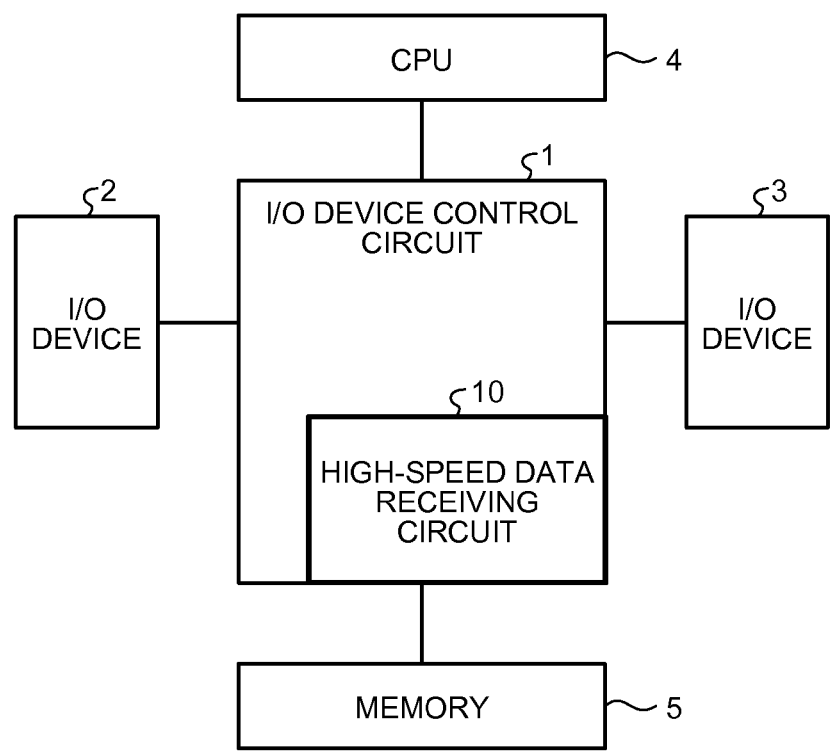
FIG. 1 is a diagram for explaining an I/O device control circuit according to a first embodiment.

In the following first embodiment, an example of an I/O (Input Output) device control circuit including a high-speed data receiving circuit is explained with FIG. 1. FIG. 1 is a diagram for explaining the I/O device control circuit according to the first embodiment.

As illustrated in FIG. 1, an I/O device control circuit 1 according to the first embodiment includes a high-speed data receiving circuit 10 as a part of a memory controller that acquires information stored in a memory 5. Furthermore, the I/O device control circuit 1 is connected to an I/O device 2, an I/O device 3, a CPU (Central Processing Unit) 4, and the memory 5.

The high-speed data receiving circuit 10 sends a read command to the memory 5. Then, the memory 5 sends back a DQ signal, which is a data signal, and a DQS signal, which is a clock signal, to the high-speed data receiving circuit 10. Then, when having received the DQ signal and the DQS signal, the high-speed data receiving circuit 10 generates a clock based on the received DQS signal and acquires information from the DQ signal by using the generated clock.

Furthermore, before the acquisition of information stored in the memory 5, the high-speed data receiving circuit 10 performs an initial-phase correcting process for determining a phase shift amount of the DQS signal in the same manner as the conventional technology. Incidentally, concrete processing contents of the initial-phase correcting process will be described later.

Figure 2:
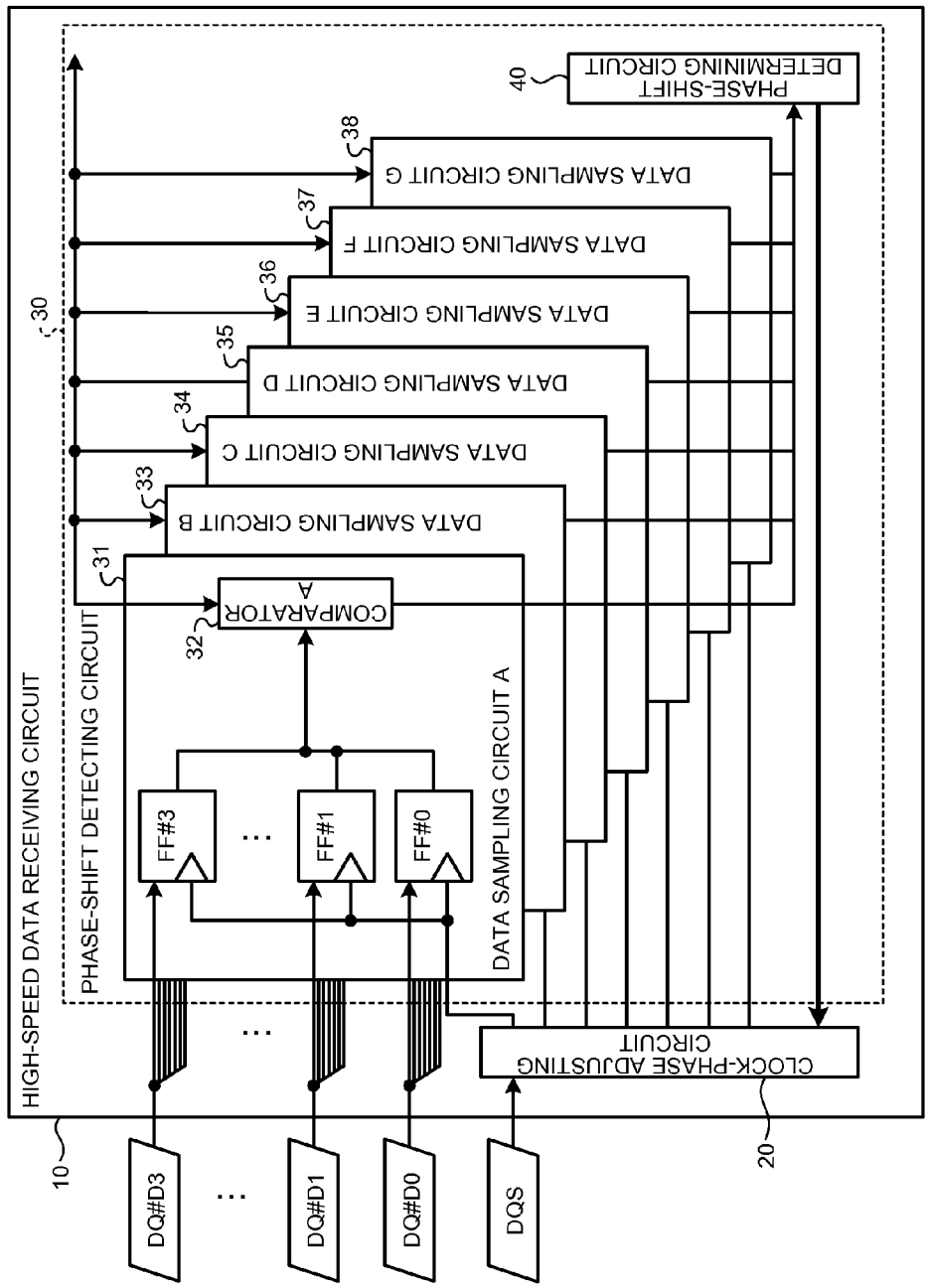
FIG. 2 is a diagram for explaining an example of a high-speed data receiving circuit according to the first embodiment.

Subsequently, units included in the high-speed data receiving circuit 10 are explained with FIG. 2. FIG. 2 is a diagram for explaining an example of the high-speed data receiving circuit according to the first embodiment. In the example illustrated in FIG. 2, the high-speed data receiving circuit 10 includes a clock-phase adjusting circuit 20 and a phase-shift detecting circuit 30. The phase-shift detecting circuit 30 includes multiple data sampling circuits A31 to G38 and a phase-shift determining circuit 40.

The clock-phase adjusting circuit 20 generates one reference clock and multiple clocks with phases, which differ from that of the reference clock step by step, on the basis of a phase of a received DQS signal. Specifically, the clock-phase adjusting circuit 20 adjusts the phase of the received DQS signal, thereby generating DQS_DLL#A to DQS_DLL#G signals with phases shifted from that of the reference clock step by step. Then, the clock-phase adjusting circuit 20 sends the generated DQS_DLL#A to DQS_DLL#G signals to the data sampling circuits A31 to G38, respectively.

Figure 3:
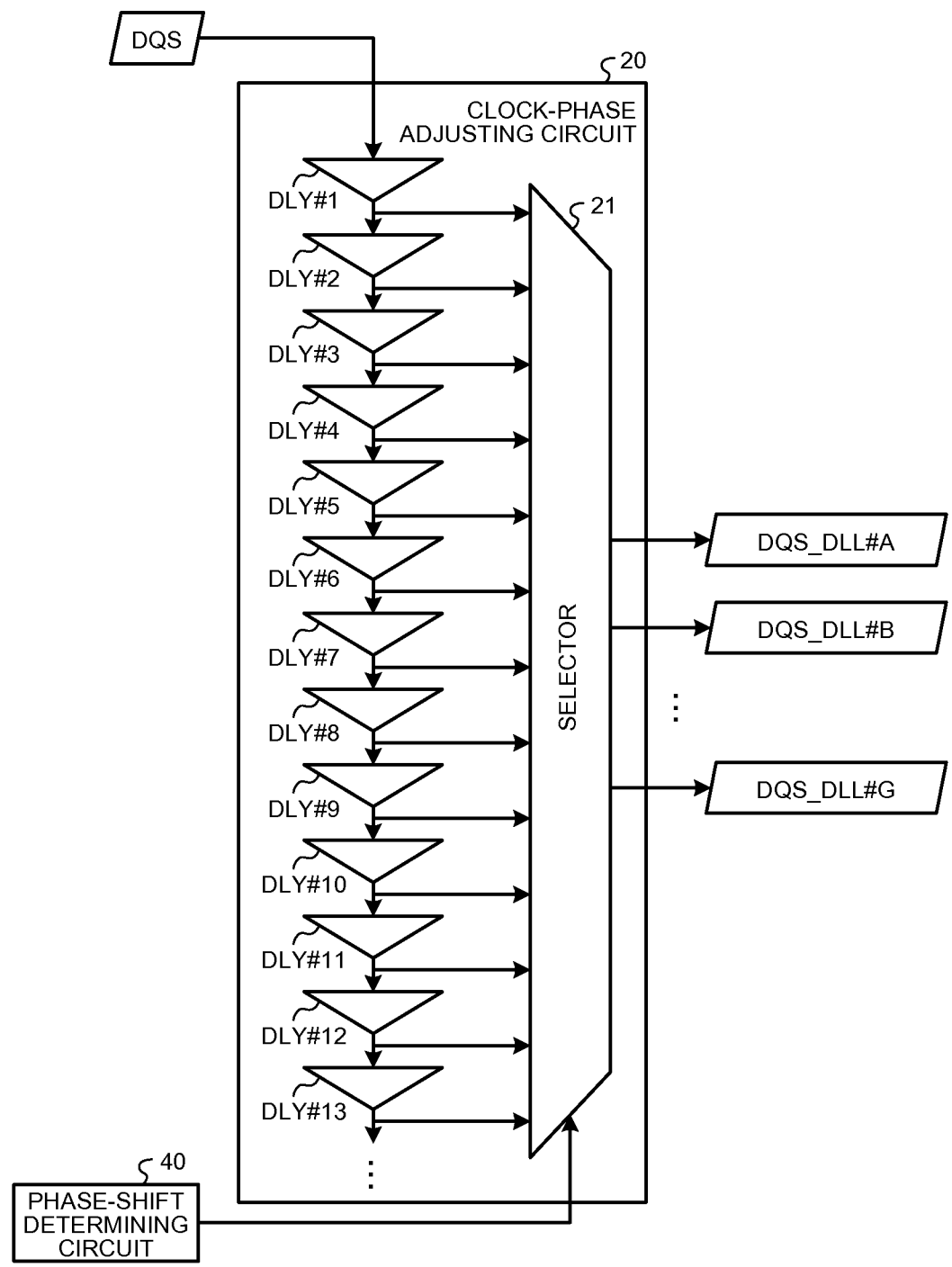
FIG. 3 is a diagram for explaining an example of a clock-phase adjusting circuit according to the first embodiment.

A process performed by the clock-phase adjusting circuit 20 is specifically explained below with FIG. 3. FIG. 3 is a diagram for explaining an example of the clock-phase adjusting circuit 20 according to the first embodiment. In the example illustrated in FIG. 3, the clock-phase adjusting circuit 20 includes a DLL (Delay Locked Loop) circuit in which multiple delay elements DLYs #1 to #13 for delaying the phase of a DQS signal are connected in series. Incidentally, the number of DLYs is just an example, and a DLL circuit provided with any number of DLYs having any delay performance can be used.

When the clock-phase adjusting circuit 20 has received a DQS signal, the clock-phase adjusting circuit 20 transmits the received DQS signal to the DLL circuit. Then, using the DLYs in stages, the clock-phase adjusting circuit 20 creates multiple signals with phases delayed from that of the received DQS signal step by step.

The clock-phase adjusting circuit 20 further includes a selector 21 that selects a reference clock and multiple clocks from signals output from the DLYs according to a phase correction signal received from the phase-shift determining circuit 40 to be described later and outputs the selected clocks. Specifically, the selector 21 acquires signals output from the DLYs, and selects one of the acquired signals as a reference clock according to a result of the initial-phase correcting process to be described later, and then sends the selected signal as a DQS_DLL#D signal to the data sampling circuit D35. Furthermore, the selector 21 selects multiple signals with phases ahead of that of the DQS_DLL#D signal and multiple signals with phases behind that of the signal selected as a reference clock as clocks, and outputs the selected signals.

Here, when there is any data inconsistent with data acquired by using the reference clock, the phase-shift determining circuit 40 to be described later determines the direction of a phase of a clock used by the data sampling circuit which has acquired the inconsistent data on the basis of the phase of the reference clock. Then, the phase-shift determining circuit 40 sends a phase correction signal indicating the determined phase direction and the number of inconsistent data to the clock-phase adjusting circuit 20.

In such a case, the selector 21 receives the phase correction signal, and selects, as a reference clock, a signal with a phase shifted from that of a signal selected as the last reference clock by the number indicated by the phase correction signal in a direction opposite to the direction indicated by the phase correction signal.

A process performed by the selector 21 is explained below with a concrete example. For example, the selector 21 selects a signal output from the DLY #10 as a DQS_DLL#D signal which is a reference clock on the basis of the initial-phase correcting process to be described later. Then, the selector 21 sends the DQS_DLL#D signal to the data sampling circuit D35.

Furthermore, when having selected a signal output from the DLY #7 as a reference clock, the selector 21 selects signals output from the DLYs #4 to #6 as DQS_DLL#A to #C signals. Then, the selector 21 sends the DQS_DLL#A to #C signals to the data sampling circuits A31, B33, and C34, respectively.

Moreover, when having selected the signal output from the DLY #7 as a reference clock, the selector 21 selects signals output from the DLYs #8 to #10 as DQS_DLL#E to #G signals. Then, the selector 21 sends the DQS_DLL#E to #G signals to the data sampling circuits E36 to G38, respectively.

Subsequently, a process performed by the selector 21 when having received a phase correction signal from the phase-shift determining circuit 40 is explained with a concrete example. For example, when the selector 21 has selected a signal output from the DLY #7 as a reference clock, the selector 21 receives a phase correction signal indicating "−2" from the phase-shift determining circuit 40 to be described later. In such a case, the selector 21 selects, as a new reference clock signal, a signal output from a DLY ahead of a DLY which outputs a signal selected as the last reference clock by two stages.

Namely, when the selector 21 has received a phase correction signal indicating "−2" on the selection of a signal output from the DLY #7 as a reference clock signal, the selector 21 newly selects a signal output from the DLY #5 ahead of the DLY #7 by two as a reference clock signal.

Furthermore, for example, when the selector 21 has received a phase correction signal indicating "+2", the selector 21 selects, as a new reference clock signal, a signal output from a DLY behind a DLY which outputs a signal selected as the last reference clock by two stages. For example, when the selector 21 has received a phase correction signal indicating "+2" on the selection of a signal output from the DLY #7 as a reference clock, the selector 21 selects a signal output from the DLY #9 as a new reference clock signal.

In this manner, on the basis of a phase correction signal received from the phase-shift determining circuit 40, the selector 21 selects a reference clock with a new phase and multiple clocks from multiple signals that the DLL circuit has generated on the basis of a DQS signal. Therefore, when the phase-shift determining circuit 40 to be described later has detected a phase shift between a DQ signal and a DQS signal, the selector 21 can immediately correct the phase of a reference clock signal in a direction opposite to the phase shift.

To return to FIG. 2, the data sampling circuits A31 to G38 acquire data from a DQ signal by using different clocks from one another out of the reference clock and multiple clocks generated by the clock-phase adjusting circuit 20. The data sampling circuits A31 to G38 are explained in detail below.

Incidentally, in the following explanation, it is assumed that the high-speed data receiving circuit 10 receives a DQ signal of which the DQ#D0 to #D3 signals are multiplexed. Furthermore, in FIG. 2, although detailed illustration of the data sampling circuits B33 to G38 is omitted, the data sampling circuits B33, C34, and E36 to G38 have the same circuit as the data sampling circuit A31. Moreover, the data sampling circuit D35 does not include a comparator, and only includes FFs that acquire information from a DQ signal.

For example, in the example illustrated in FIG. 2, the data sampling circuit A31 includes flip-flops (hereinafter, referred to simply as "FFs") #0 to #3 and a comparator A32. The FFs #0 to #3 receive DQ#D0 to #D3 signals, respectively, and receive a DQS_DLL#A signal from the clock-phase adjusting circuit 20. Then, the FFs #0 to #3 retrieve voltage values of the DQ#D0 to #D3 signals with the transition of a voltage value of the received DQS_DLL#A signal into a state in which the voltage value is higher than a predetermined threshold value as a trigger. Namely, the FFs #0 to #3 acquire information from a DQ signal at the timing indicated by the DQS_DLL#A signal generated by the clock-phase adjusting circuit 20.

The comparator A32 acquires respective pieces of information acquired by the FFs #0 to #3 of the data sampling circuit A31 and DQ#D0 to D3. Then, the comparator A32 determines whether the pieces of information acquired by the FFs #0 to #3 of the data sampling circuit A31 are consistent with DQ#D0 to D3 which is information acquired by the data sampling circuit D35.

Here, the data sampling circuit D35 acquires information from the DQ signal by using a DQS_DLL#D signal selected as a reference clock. Therefore, the comparator A32 determines whether information acquired from the same signal on the basis of the phase of the DQS_DLL#A signal is consistent with information acquired on the basis of the phase of the DQS_DLL#D signal which is a reference clock. After that, the comparator A32 notifies the phase-shift determining circuit 40 of a result of the determination of whether the information acquired by the data sampling circuit A31 is consistent with DQ#D0 to D3.

The data sampling circuits B33, C34, and E36 to G38 determine whether their acquired pieces of information are consistent with DQ#D0 to D3 with a comparator included in each circuit. Then, the data sampling circuits B33, C34, and E36 to G38 notify the phase-shift determining circuit 40 of a result of the determination of whether the their acquired pieces of information are consistent with DQ#D0 to D3.

The data sampling circuit D35 acquires information from a DQ signal by using a DQS_DLL#D signal received from the clock-phase adjusting circuit 20. Then, the data sampling circuit D35 sends the acquired information as DQ#D0 to D3 to the comparators included in the other data sampling circuits A31, B33, C34, and E36 to G38. Furthermore, the data sampling circuit D35 outputs DQ#D0 to D3 as information received from the memory 5 to the other circuits included in the I/O device control circuit 1.

In this manner, the data sampling circuits A31 to C34 acquire information from a DQ signal by using a clock with a phase ahead of that of a reference clock used by the data sampling circuit D35. Then, the data sampling circuits A31 to C34 notify the phase-shift determining circuit 40 of a result of determination of whether the their acquired pieces of information are consistent with DQ#D0 to D3.

Furthermore, the data sampling circuits E36 to G38 acquire information from the DQ signal by using a clock with a phase behind that of the reference clock used by the data sampling circuit D35. Then, the data sampling circuits E36 to G38 notify the phase-shift determining circuit 40 of a result of determination of whether the their acquired pieces of information are consistent with DQ#D0 to D3.

To return to FIG. 2, the phase-shift determining circuit 40 determines whether respective pieces of information acquired by the data sampling circuits A31, B33, C34, and E36 to G38 are consistent with DQ#D0 to D3. Then, when different information from DQ#D0 to D3 has been acquired, the phase-shift determining circuit 40 corrects the phase of the DQS_DLL#D signal in a direction opposite to the phase of a signal used by the data sampling circuit which has acquired the inconsistent information. Namely, the phase-shift determining circuit 40 detects a phase shift between a DQS signal and a DQ signal, and performs the correction taken in consideration of the detected phase shift.

Specifically, each time the data sampling circuits A31 to G38 acquire information, the phase-shift determining circuit 40 acquires notification from the respective comparators included in the data sampling circuits A31 to G38. Then, the phase-shift determining circuit 40 determines whether there is any circuit which has acquired information inconsistent with DQ#D0 to D3 on the basis of the acquired notification. When respective pieces of information acquired by the data sampling circuits A31 to G38 are all consistent with DQ#D0 to D3, the phase-shift determining circuit 40 determines that a state of phase shift is "state 0" in which the phase shift need not be corrected.

Furthermore, when there is a circuit which has acquired information inconsistent with DQ#D0 to D3, the phase-shift determining circuit 40 determines whether respective pieces of information acquired by the data sampling circuits C34 and E36 are consistent with DQ#D0 to D3. When the respective pieces of information acquired by the data sampling circuits C34 and E36 are consistent with DQ#D0 to D3, the phase-shift determining circuit 40 determines whether respective pieces of information acquired by the data sampling circuits A31 to C34 are consistent with DQ#D0 to D3. In addition, the phase-shift determining circuit 40 determines whether respective pieces of information acquired by the data sampling circuits E36 to G38 are consistent with DQ#D0 to D3.

Then, when the respective pieces of information acquired by the data sampling circuits A31 to C34 or the data sampling circuits E36 to G38 are consistent with DQ#D0 to D3, the phase-shift determining circuit 40 determines that a state of phase shift is "state 1". Furthermore, when having determined that a state of phase shift is "state 1", the phase-shift determining circuit 40 counts the number of data sampling circuits which have acquired information inconsistent with DQ#D0 to D3.

Moreover, the phase-shift determining circuit 40 determines the direction of a phase of a clock signal used by the data sampling circuit which has acquired different information from DQ#D0 to D3 on the basis of the phase of the DQS_DLL#D signal. Then, the phase-shift determining circuit 40 generates a phase correction signal indicating the determined phase direction and the counted number of data sampling circuits, and sends the generated phase correction signal to the clock-phase adjusting circuit 20.

Namely, when the phase of the DQ signal is shifted to a direction of a phase ahead of that of the DQS signal, respective pieces of information acquired on the basis of DQS_DLL#E to #G signals with phases behind that of the DQS_DLL#D signal become inconsistent with the information acquired on the basis of the DQS_DLL#D signal. Furthermore, when the phase of the DQ signal is shifted to a direction of a phase behind that of the DQS signal, respective pieces of information acquired on the basis of DQS_DLL#A to #C signals with phases ahead of that of the DQS_DLL#D signal become inconsistent with the information acquired on the basis of the DQS_DLL#D signal.

Therefore, the phase-shift determining circuit 40 detects the magnitude and direction of the phase shift between the DQS signal and the DQ signal on the basis of the notification acquired from the respective comparators included in the data sampling circuits A31 to G38. Then, the phase-shift determining circuit 40 generates a phase correction signal indicating the detected magnitude and direction of the phase shift, and sends the generated phase correction signal to the clock-phase adjusting circuit 20.

Here, when a phase difference between the DQS signal and the DQ signal is too large, and respective pieces of information acquired by the data sampling circuits C34 and E36 are different from DQ#D0 to D3, it is difficult to say that the phase of the DQS_DLL#D signal can be accurately corrected. So, when the respective pieces of information acquired by the data sampling circuits C34 and E36 are not consistent with DQ#D0 to D3, the phase-shift determining circuit 40 determines that a state of phase shift is "state 2" in which the phase shift is not corrected. In such a case, the high-speed data receiving circuit 10 suspends the operation, and again performs the initial-phase correcting process.

Furthermore, when respective pieces of information acquired by all the data sampling circuits A31 to G38 are consistent, the phase-shift determining circuit 40 determines that a state of phase shift is "state 0" in which the phase shift is not corrected. In such a case, the phase-shift determining circuit 40 does not generate a phase correction signal, and retains the phases of DQS_DLL#A to #G signals generated by the clock-phase adjusting circuit 20.

Subsequently, the flow of a process performed by the phase-shift determining circuit 40 is explained with a concrete example. For example, the phase-shift determining circuit 40 acquires notification that the data sampling circuits A31 and B33 have acquired information inconsistent with DQ#D0 to D3 from the respective comparators of the data sampling circuits A31 and B33. Furthermore, the phase-shift determining circuit 40 acquires notification that the data sampling circuits C34 and E36 to G38 have acquired information consistent with DQ#D0 to D3 from the respective comparators of the data sampling circuits C34 and E36 to G38.

In this example, the phase-shift determining circuit 40 determines that a state of phase shift is "state 1". Furthermore, the phase-shift determining circuit 40 determines that the data sampling circuits A31 and B33 which use a clock with a phase ahead of that of a DQS_DLL#D signal have acquired false information. In such a case, the phase-shift determining circuit 40 generates a phase correction signal indicating "+2" to delay the phase of the DQS_DLL#D signal by two DLYs of the clock-phase adjusting circuit 20, and sends the generated phase correction signal to the clock-phase adjusting circuit 20.

Furthermore, for example, the phase-shift determining circuit 40 acquires notification that the data sampling circuit G38 has acquired information inconsistent with DQ#D0 to D3 from the comparator of the data sampling circuit G38 only. In this example, the phase-shift determining circuit 40 determines that a state of phase shift is "state 1", and generates a phase correction signal indicating "−1" to set the phase of the DQS_DLL#D signal ahead by one DLY, and sends the generated phase correction signal to the clock-phase adjusting circuit 20.

Moreover, for example, the phase-shift determining circuit 40 acquires notification that the data sampling circuits A31, B33, and C34 have acquired information inconsistent with DQ#D0 to D3 from the respective comparators of the data sampling circuits A31, B33, and C34. In this example, the phase-shift determining circuit 40 determines that a state of phase shift is "state 2" in which the phase shift is not corrected. In such a case, the high-speed data receiving circuit 10 suspends the operation, and again performs the initial-phase correcting process.

Furthermore, for example, the phase-shift determining circuit 40 acquires notification that any of the data sampling circuits A31, B33, and C34 and any of the data sampling circuits E36 to G38 have acquired inconsistent information from the respective comparators of the corresponding data sampling circuits at the same time. In this example, the phase-shift determining circuit 40 determines that phase shift corresponds to "state 2" in which the phase shift is not fixed. In such a case, the high-speed data receiving circuit 10 suspends the operation, and again performs the initial-phase correcting process.

In this manner, the phase-shift determining circuit 40 determines whether respective pieces of information acquired by the data sampling circuits A31 to C34 and E36 to G38 are consistent with DQ#D0 to D3. Then, the phase-shift determining circuit 40 generates a phase correction signal indicating the number of data sampling circuits which have acquired inconsistent information and the direction of a phase of a clock used by the data sampling circuit which has acquired the inconsistent information based on the phase of the DQS_DLL#D signal. After that, the phase-shift determining circuit 40 sends the generated phase correction signal to the clock-phase adjusting circuit 20.

Namely, the phase-shift determining circuit 40 corrects the phases of DQS_DLL#A to #G signals to the opposite side of a phase of a clock used by the data sampling circuit which has acquired the inconsistent information based on the phase of the DQS_DLL#D signal. Consequently, the high-speed data receiving circuit 10 can properly acquire information from a DQ signal continuously.

In recent years, with the increase in speed of transmission and reception of information, frequencies of a data signal and a clock signal get higher, and the phase of the data signal and the phase of the clock signal are likely to be out of synchronization, and as a result, the signal waveform quality (an eye pattern) tends to deteriorate. Namely, there is an increased number of cases where the phase of a data signal and the phase of a clock signal do not always fluctuate in the same pattern. Therefore, the conventional method of correcting the phase of a DQS signal according to a phase shift between the DQS signal and a reference clock reaches a phase adjustable limit.

On the other hand, the phase-shift determining circuit 40 detects a phase shift by comparing respective pieces of information acquired by the data sampling circuits A31 to G38, and corrects the phases of DQS_DLL#A to #G signals according to the detected phase shift. Therefore, even on the occurrence of a phase shift between a data signal and a clock signal, the high-speed data receiving circuit 10 can properly acquire information.

Furthermore, each time the data sampling circuits A31 to G38 acquire information, the phase-shift determining circuit 40 continuously detects a phase shift between a DQS signal and a DQ signal, and continues to correct the phases of DQS_DLL#A to #G signals according to the detected phase shift. Consequently, the phase-shift determining circuit 40 can appropriately correct the phases of DQS_DLL#A to #G signals while the phase shift corresponds to "state 1" and prevent the phase shift from falling into "state 2".

Namely, a phase shift between a DQS signal and a DQ signal fluctuates only slightly in a unit of one read cycle. That is, during the course of continuous reception of DQ signals from the memory 5, a phase shift between a DQS signal and a DQ signal makes the transition from "state 0" to "state 1", and then makes the transition to "state 2". However, the phase-shift determining circuit 40 continues to correct the phases of DQS_DLL#A to #G signals, and therefore can appropriately correct the phases of the DQS_DLL#A to #G signals and prevent the phase shift from falling into "state 2".

As a result, the high-speed data receiving circuit 10 can retain the timing margin between a DQS signal and a DQ signal, and eliminate the need for the second initial-phase correcting process, and avoid suspension of the system operation leading to performance degradation.

Figure 4:
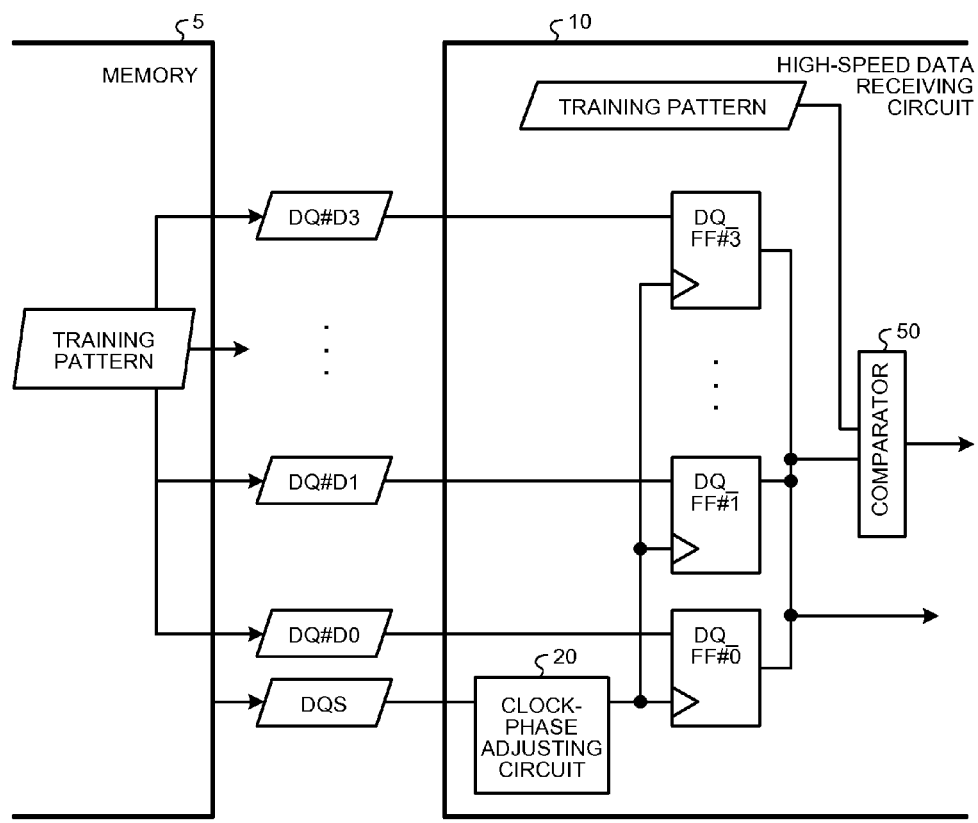
FIG. 4 is a diagram for explaining an initial-phase correcting process.

Subsequently, the initial-phase correcting process is explained with FIG. 4. FIG. 4 is a diagram for explaining the initial-phase correcting process. In an example illustrated in FIG. 4, the high-speed data receiving circuit 10 and the memory 5 store a training pattern which is predetermined information. In such a case, the high-speed data receiving circuit receives a DQ signal storing the training pattern stored in the memory 5 by using an arbitrary data sampling circuit.

Here, the high-speed data receiving circuit 10 transmits a DQS signal sent from the memory 5 to the clock-phase adjusting circuit 20 to delay the phase of the DQS signal. Then, using the DQS signal with the delayed phase, the high-speed data receiving circuit 10 acquires information from the DQ signal. After that, with use of a comparator 50, the high-speed data receiving circuit 10 determines whether the acquired information is consistent with the previously-stored training pattern.

Furthermore, the high-speed data receiving circuit 10 sequentially changes an amount of delay of the phase of a DQS signal, and determines whether information consistent with the stored training pattern can be acquired in a whole phase range of the DQS signal that the clock-phase adjusting circuit 20 can delay. After that, the high-speed data receiving circuit 10 adopts, out of the whole phase range of the DQS signal that the clock-phase adjusting circuit 20 can delay, the center of the range in which information consistent with the training pattern can be acquired as an initial phase correction amount.

Figure 5:
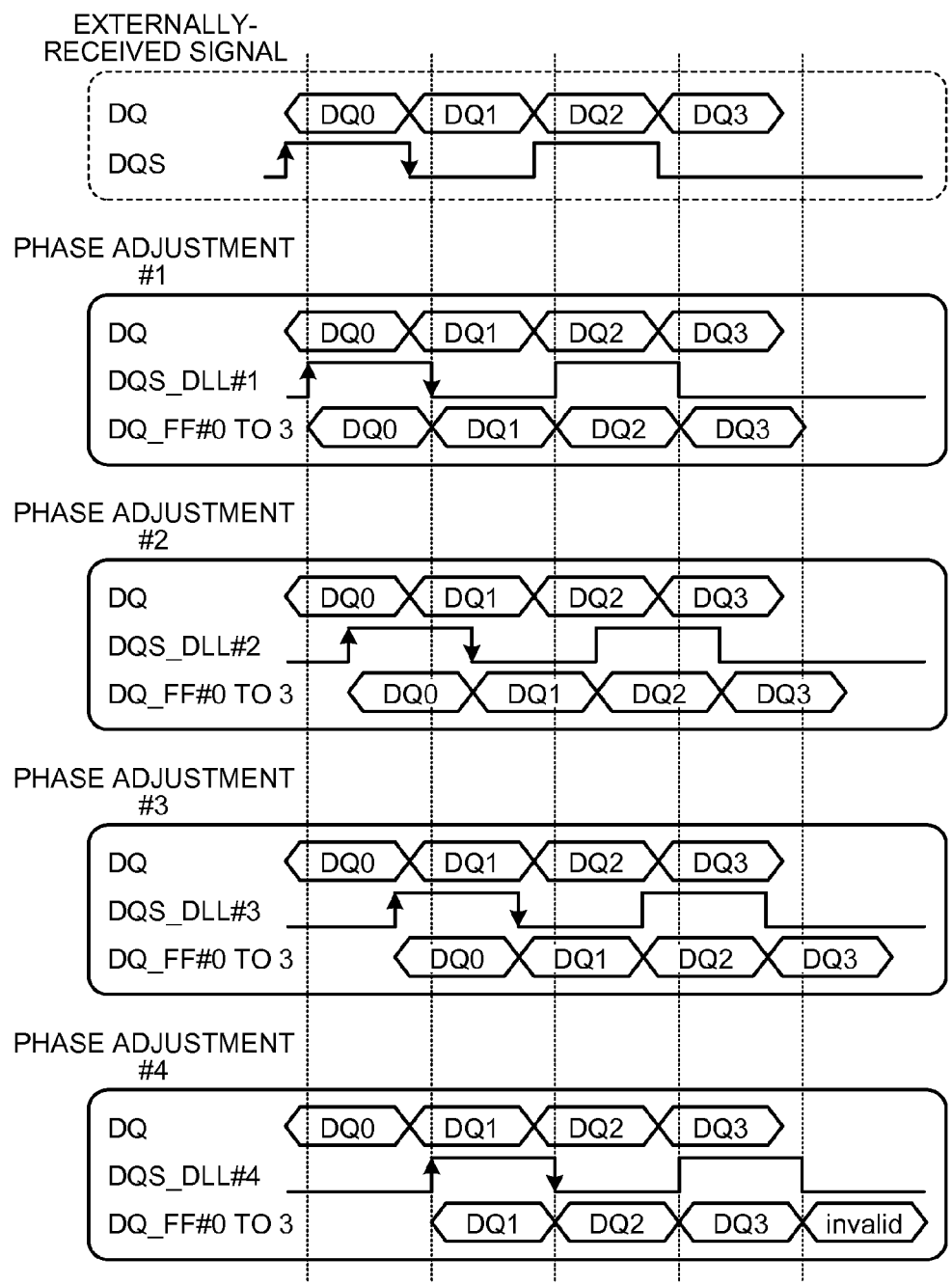
FIG. 5 is a diagram for explaining a phase correction amount in the initial-phase correcting process.

For example, the high-speed data receiving circuit 10 receives a DQ signal and a DQS signal illustrated in FIG. 5 as an externally-received signal. In such a case, as illustrated in phase adjustment #1 to #4 in FIG. 5, the high-speed data receiving circuit 10 sequentially changes an amount of delay of the phase of the DQS signal, and acquires a training pattern by using DQS_DLL#1 to #4 which differ in an amount of delay from one another. In an example illustrated in FIG. 5, when the high-speed data receiving circuit 10 uses DQS_DLL#1 to #3, the high-speed data receiving circuit 10 acquires an accurate training pattern.

In such a case, the high-speed data receiving circuit 10 determines that DQS_DLL#2 at the center of a whole range in which a training pattern can be acquired normally is the optimum phase. After that, the high-speed data receiving circuit 10 adopts an amount of delay of DQS_DLL#2 based on the phase of the DQS signal as an initial predetermined amount. Namely, the high-speed data receiving circuit 10 selects a signal selected as DQS_DLL#2 as a DQS_DLL#D signal. FIG. 5 is a diagram for explaining a phase correction amount in the initial-phase correcting process.

Figure 6:
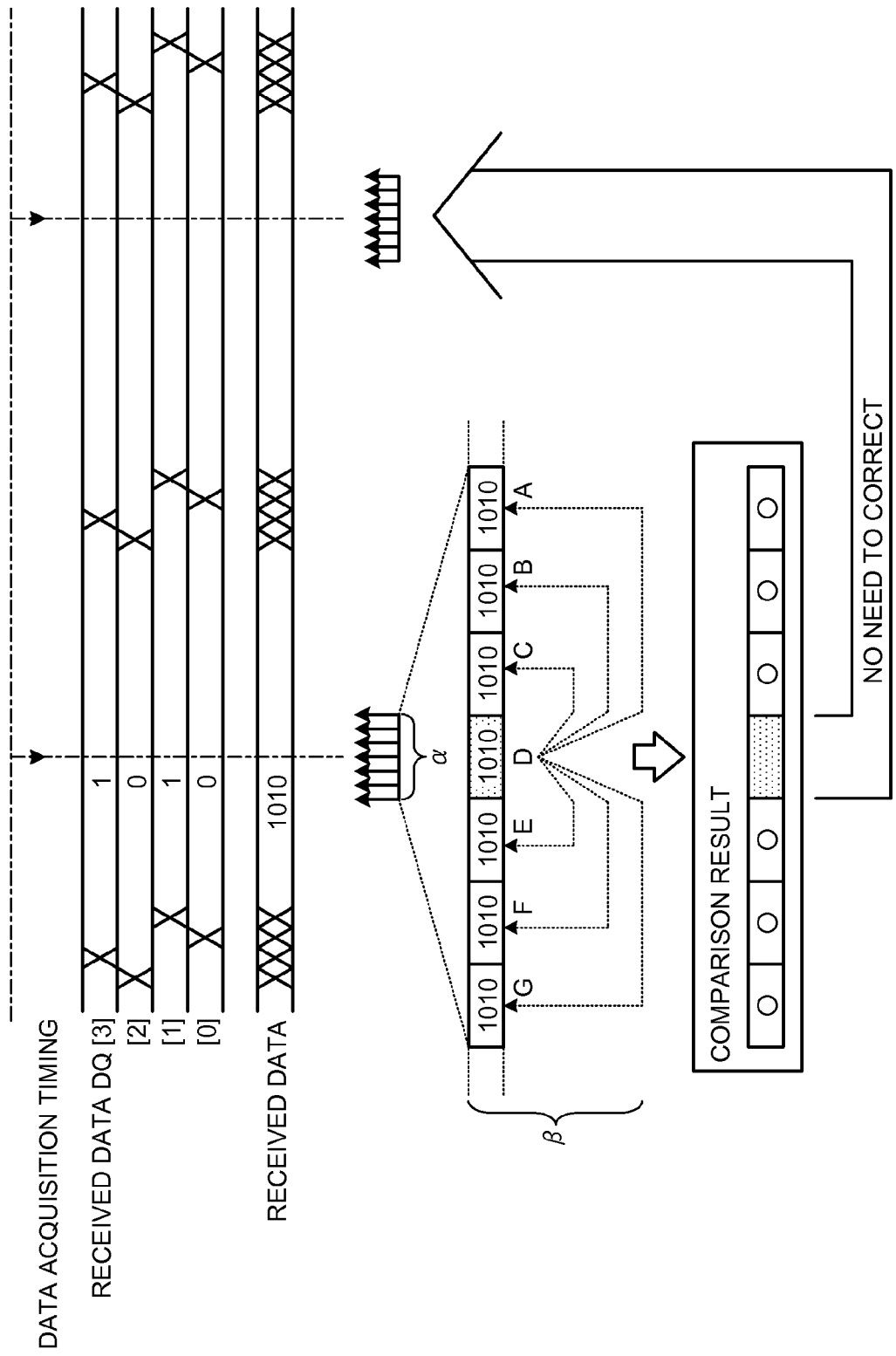
FIG. 6 is a diagram for explaining a correction process performed in a case of state 0.

Subsequently, a process of correcting phases of DQS_DLL#A to #G signals performed by the high-speed data receiving circuit 10 is explained with FIGS. 6 to 11. First, the process performed when a state of phase shift between a DQ signal and a DQS signal is "state 0" is explained with FIG. 6. FIG. 6 is a diagram for explaining the correction process performed in a case of "state 0".

Here, a broken line in FIG. 6 indicates timing of phase at which the data sampling circuit D35 acquires information. Furthermore, X marks in received data DQ [0] to [3] in FIG. 6 indicate timing at which information of multiplexed DQ#D0 to #D3 signals is switched. Namely, the received data DQ [0] to [3] in FIG. 6 contain data eyes of the DQ#D0 to #D3 signals, respectively. Moreover, α in FIG. 6 indicates timing of phase at which the data sampling circuits A31 to G38 acquire information. Furthermore, β in FIG. 6 indicates the information acquired by the data sampling circuits A31 to G38.

In an example illustrated in FIG. 6, the information acquired by the data sampling circuits A31 to G38 is all consistent "1010". Therefore, the high-speed data receiving circuit 10 does not perform the phase correction of the DQS_DLL#A to #G signals used by the data sampling circuits A31 to G38, and acquires information from the next data eye.

Figure 7:
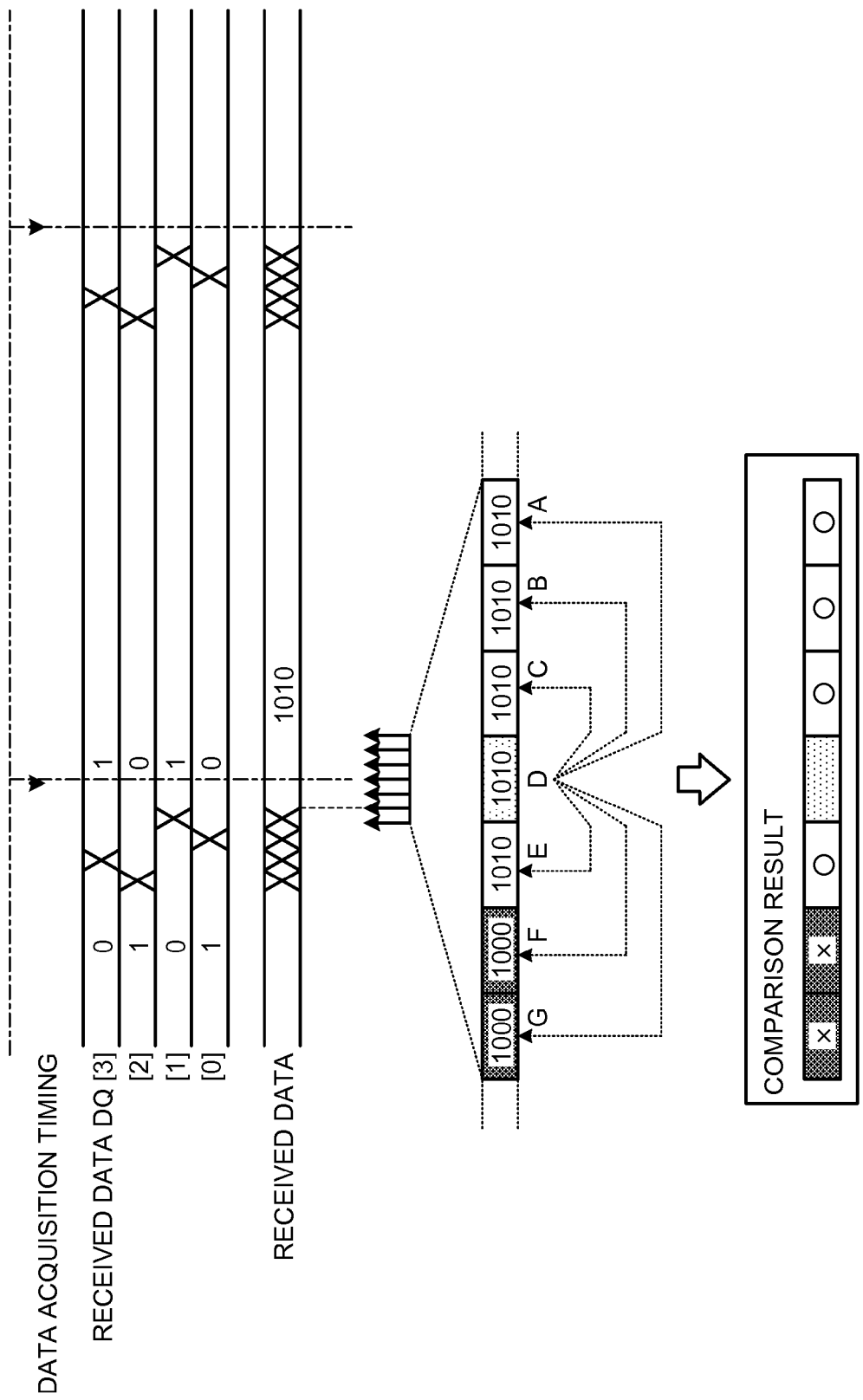
FIG. 7 is a diagram for explaining state 1.
Figure 8:
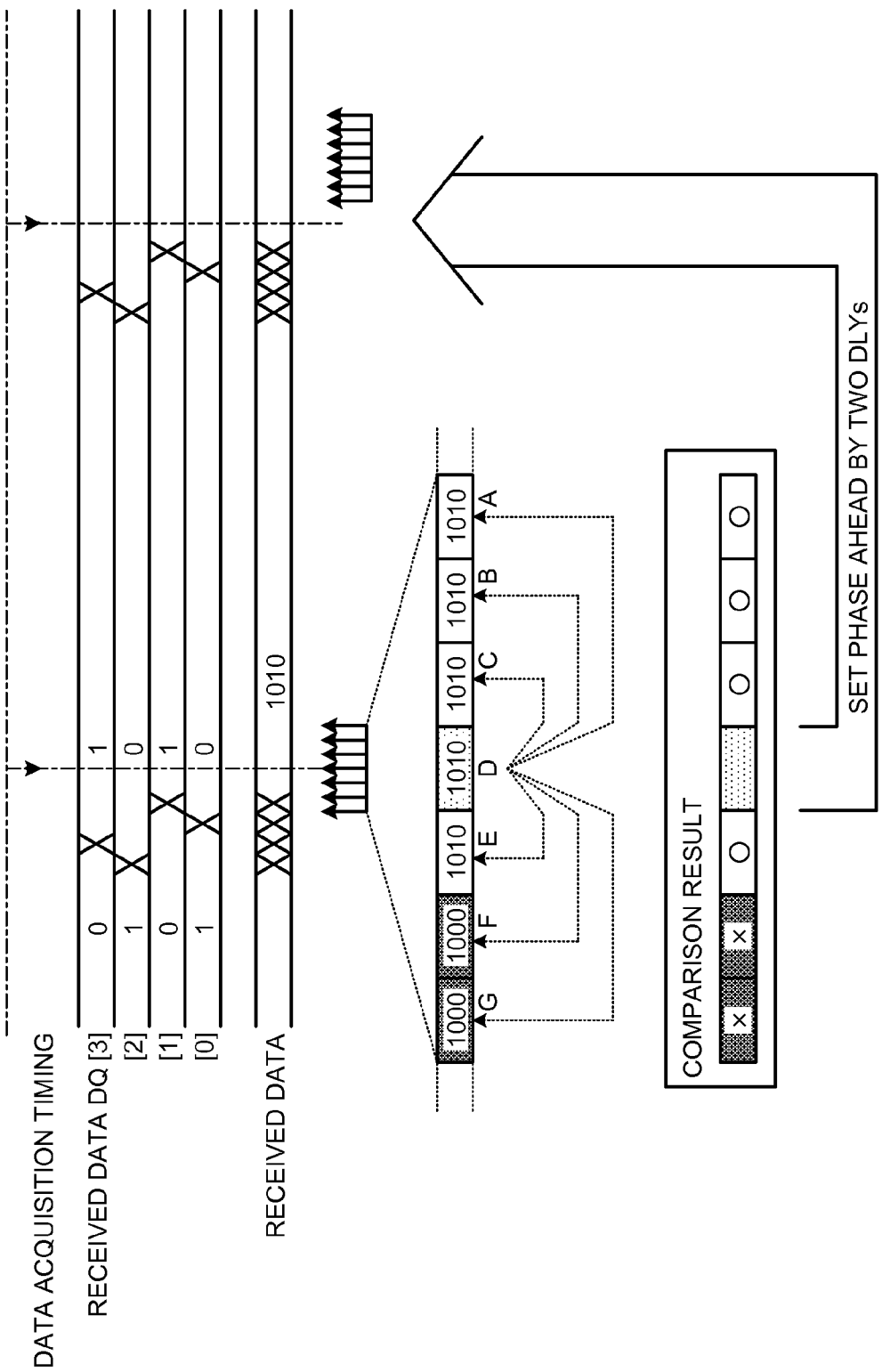
FIG. 8 is a diagram for explaining a correction process performed in a case of state 1.
Figure 9:
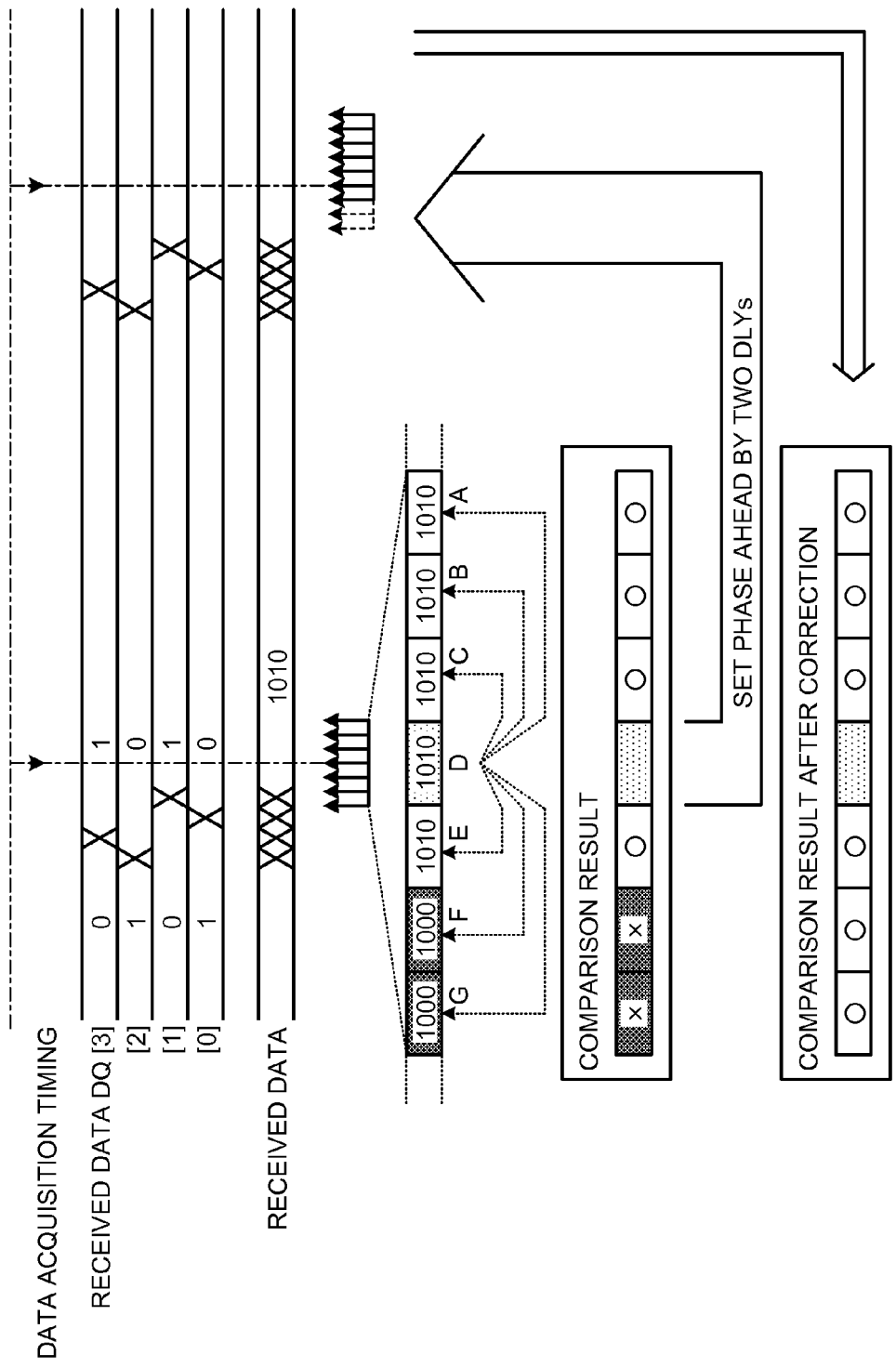
FIG. 9 is a diagram for explaining a result of correction by the correction process.

Subsequently, the process performed when the phase of a DQS signal has lagged behind the phase of a DQ signal is explained with FIGS. 7 to 9. FIG. 7 is a diagram for explaining state 1. FIG. 8 is a diagram for explaining a correction process performed in a case of state 1. FIG. 9 is a diagram for explaining a result of correction by the correction process.

In an example illustrated in FIG. 7, the information acquisition timing of the data sampling circuits F37 and G38 overlaps with the timing at which information of a DQ signal is switched, and the data sampling circuits F37 and G38 acquire "1000" which is different information from that is acquired by the data sampling circuit D35. Therefore, the high-speed data receiving circuit 10 determines that the phase shift between the DQ signal and the DQS signal corresponds to "state 1".

In such a case, as illustrated in FIG. 8, the high-speed data receiving circuit 10 sets the phases of DQS_DLL#A to #G signals ahead by two DLYs. As a result, the high-speed data receiving circuit 10 can keep the timing at which the data sampling circuits A31 to G38 acquire information within a data eye; therefore, as illustrated in FIG. 9, the phase shift can be restored to "state 0".

Figure 10:
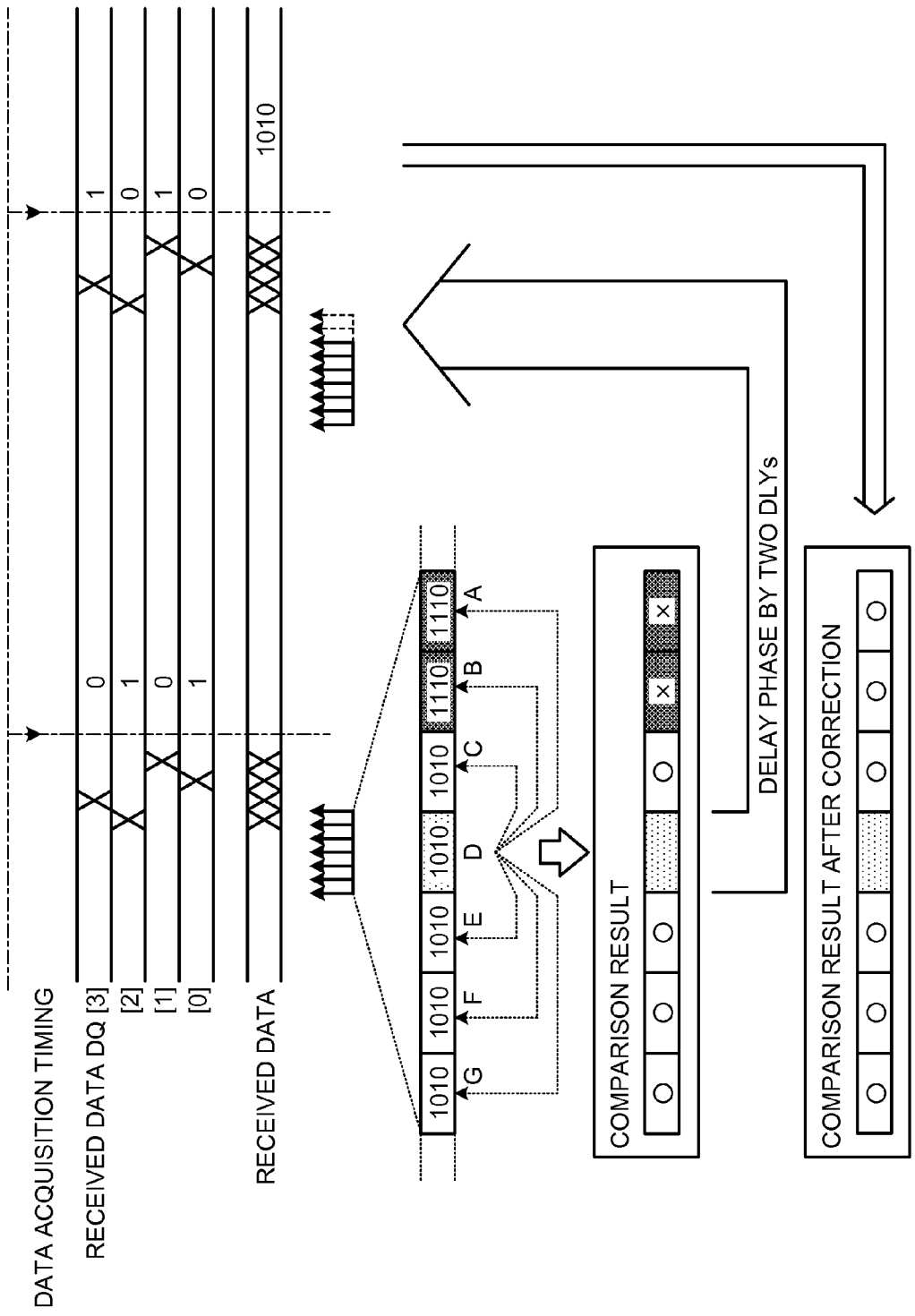
FIG. 10 is a diagram for explaining a correction process and a result of the correction process.

Subsequently, the process performed when the phase of a DQS signal has been ahead of the phase of a DQ signal is explained with FIG. 10. FIG. 10 is a diagram for explaining a correction process and a result of the correction process. In an example illustrated in FIG. 10, the information acquisition timing of the data sampling circuits A31 and B33 overlaps with the timing at which information of a DQ signal is switched, and the data sampling circuits A31 and B33 acquire "1110" which is different information from that is acquired by the data sampling circuit D35. Therefore, the high-speed data receiving circuit 10 determines that the phase shift between the DQ signal and the DQS signal corresponds to "state 1".

So, as illustrated in FIG. 10, the high-speed data receiving circuit 10 delays the phases of DQS_DLL#A to #G signals by two DLYs. As a result, the high-speed data receiving circuit 10 can keep the timing at which the data sampling circuits A31 to G38 acquire information within a data eye; therefore, as illustrated in FIG. 10, the phase shift can be restored to "state 0".

Figure 11:
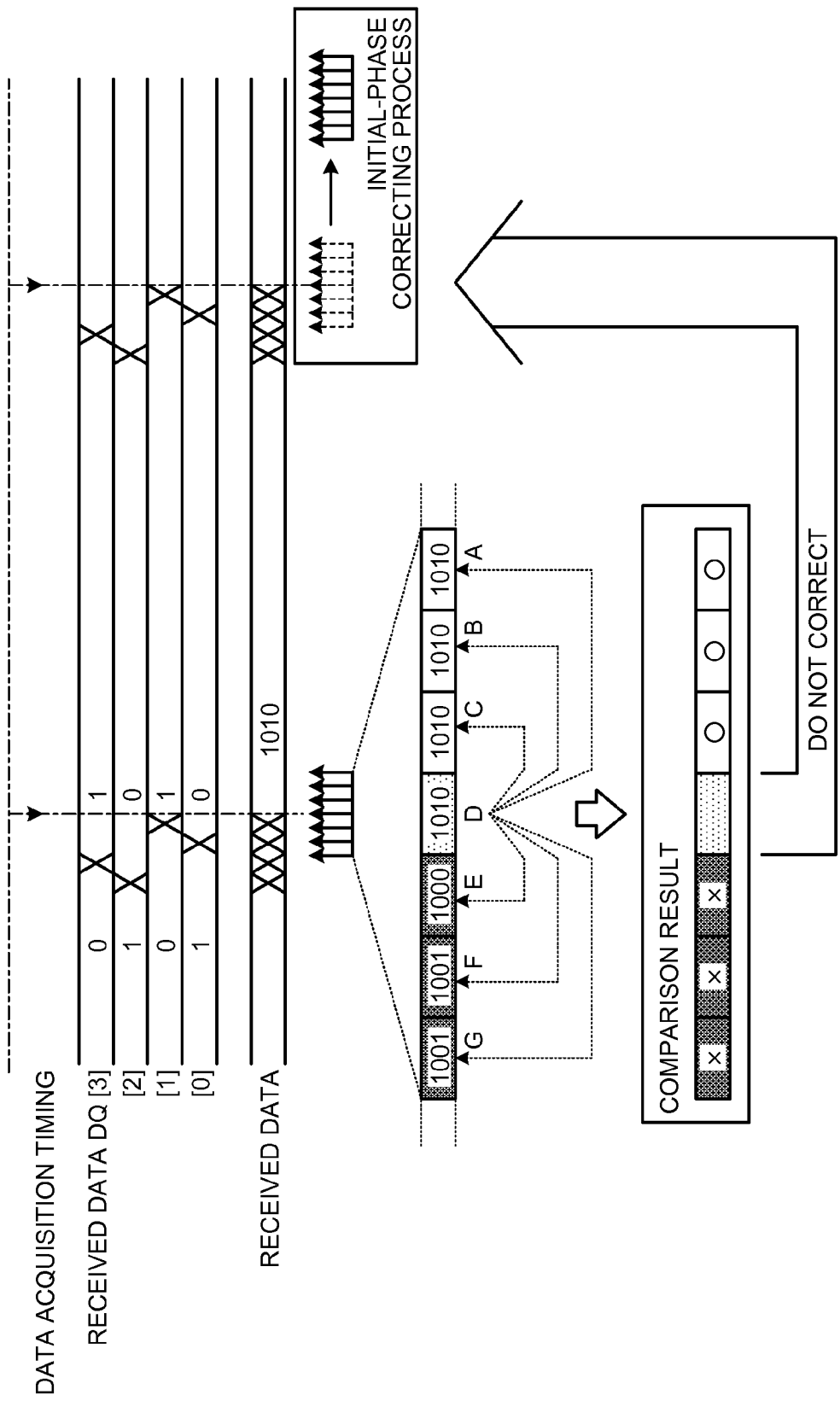
FIG. 11 is a diagram for explaining a correction process performed in a case of state 2.

On the other hand, FIG. 11 is a diagram for explaining a correction process performed in a case of state 2. As illustrated in FIG. 11, when the data sampling circuits E36 to G38 have acquired different information from that has been acquired by the data sampling circuit D35, the timing at which the data sampling circuit D35 acquires information is off to the boundary at which information of a DQ signal is switched. In such a case, the high-speed data receiving circuit 10 does not perform the correction and stops receiving a DQ signal, and again performs the initial-phase correcting process.

Subsequently, a phase correction amount of DQS_DLL#A to #G signals whose phases are corrected by the high-speed data receiving circuit 10 is explained with FIG. 12. FIG. 12 is a diagram for explaining the phase correction amount. Furthermore, FIG. 12 provides an example of whether information acquired by the data sampling circuits A31 to C34 and E36 to G38 is consistent with information acquired by the data sampling circuit D35.

In the example illustrated in FIG. 12, in a case of "state 0", the high-speed data receiving circuit 10 does not correct the phases of DQS_DLL#A to #G. On the other hand, when only the data sampling circuit A31 has acquired different information from that has been acquired by the data sampling circuit D35, the high-speed data receiving circuit 10 delays the phases of DQS_DLL#A to #G by one DLY. Furthermore, when the data sampling circuit A31 and the data sampling circuit B33 have acquired different information from that has been acquired by the data sampling circuit D35, the high-speed data receiving circuit 10 delays the phases of DQS_DLL#A to #G by two DLYs.

Moreover, when only the data sampling circuit G38 has acquired different information from that has been acquired by the data sampling circuit D35, the high-speed data receiving circuit 10 sets the phases of DQS_DLL#A to #G ahead by one DLY. Furthermore, when the data sampling circuits F37 and G38 have acquired different information from that has been acquired by the data sampling circuit D35, the high-speed data receiving circuit 10 sets the phases of DQS_DLL#A to #G ahead by two DLYs. Moreover, in a case of "state 2", the high-speed data receiving circuit 10 does not correct the phases of DQS_DLL#A to #G, and performs the initial-phase correcting process.

[Flow of Processing by High-Speed Data Receiving Circuit]

Figure 13:
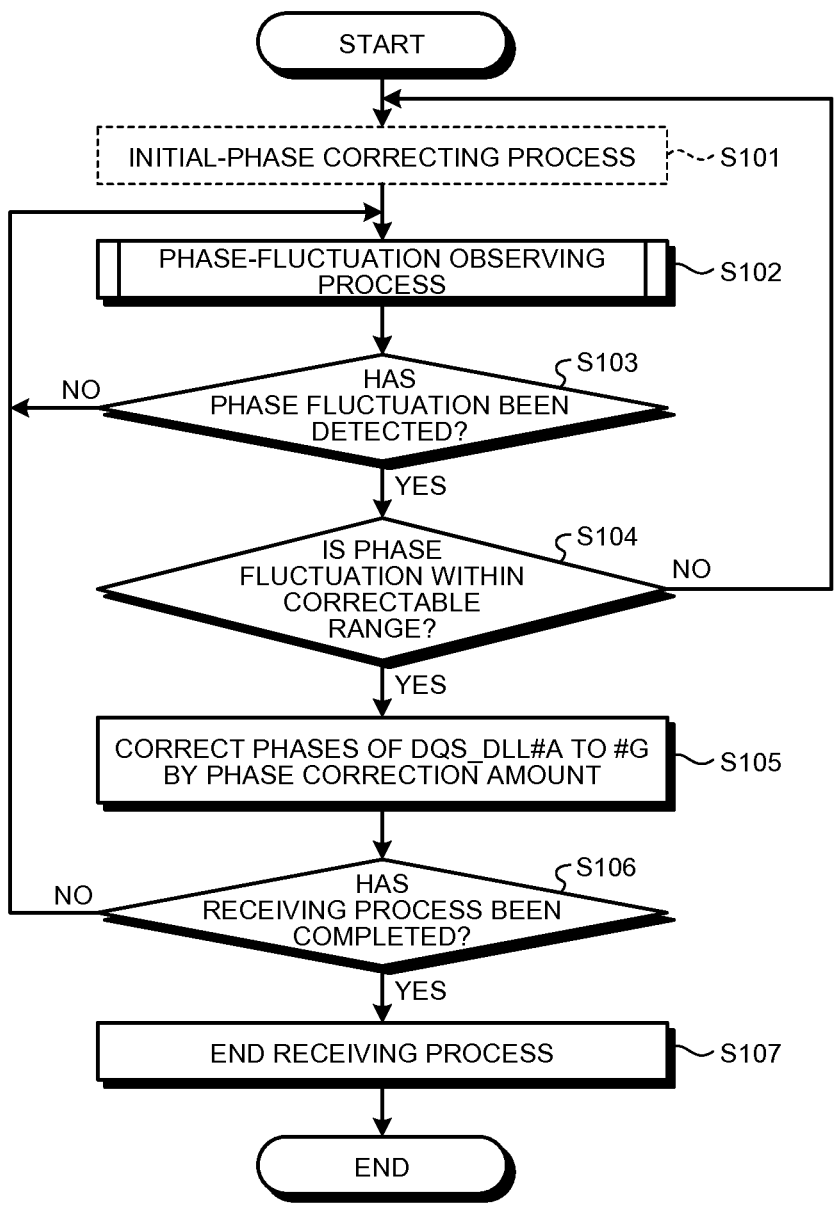
FIG. 13 is a flowchart for explaining the flow of processing by the high-speed data receiving circuit according to the first embodiment.

Subsequently, the flow of a process performed by the high-speed data receiving circuit 10 is explained with FIG. 13. FIG. 13 is a flowchart for explaining the flow of processing by the high-speed data receiving circuit according to the first embodiment. In an example illustrated in FIG. 13, the high-speed data receiving circuit 10 starts the process on start-up of the system as a trigger.

First, the high-speed data receiving circuit 10 performs an initial-phase correcting process (Step S101). Next, the high-speed data receiving circuit 10 compares information acquired by the data sampling circuits A31 to G38, and detects phase fluctuation (Step S102). Then, the high-speed data receiving circuit 10 determines whether phase fluctuation has been detected (Step S103).

Then, when having determined that phase fluctuation has not been detected (NO at Step S103), the high-speed data receiving circuit 10 again detects phase fluctuation (Step S102). On the other hand, when having determined that phase fluctuation has been detected (YES at Step S103), the high-speed data receiving circuit 10 determines whether the phase fluctuation is within a correctable range (Step S104). Namely, the high-speed data receiving circuit 10 determines whether the phase shift corresponds to "state 1" or "state 2".

Then, when having determined that the phase fluctuation is not within a correctable range (NO at Step S104), i.e., when having determined that the phase shift corresponds to "state 2", the high-speed data receiving circuit 10 again performs the initial-phase adjusting process (Step S101). On the other hand, when having determined that the phase fluctuation is within a correctable range (YES at Step S104), i.e., when having determined that the phase shift corresponds to "state 1", the high-speed data receiving circuit 10 corrects the phases of DQS_DLL#A to #G by a phase correction amount (Step S105).

After that, the high-speed data receiving circuit 10 determines whether a process of receiving information has been completed (Step S106). Then, when the information receiving process has been completed (YES at Step S106), the high-speed data receiving circuit 10 ends the reception (Step S107), and then ends the process. On the other hand, when the information receiving process has not been completed (NO at Step S106), the high-speed data receiving circuit 10 again observes phase fluctuation (Step S102).

Figure 14:
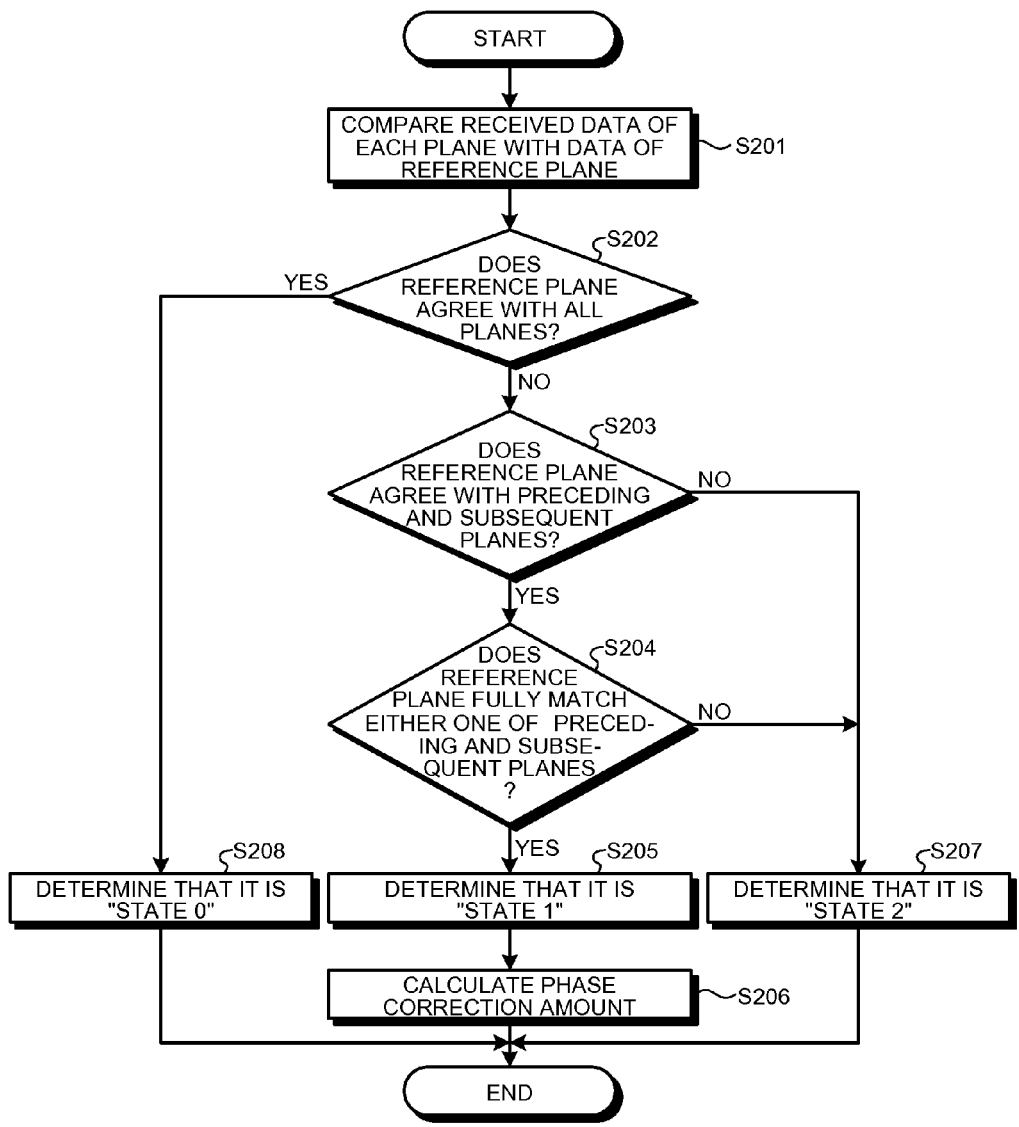
FIG. 14 is a flowchart for explaining the flow of a phase-fluctuation observing process.

Subsequently, the flow of the phase-fluctuation observing process (Step S102 in FIG. 13) is explained in detail with FIG. 14. FIG. 14 is a flowchart for explaining the flow of the phase-fluctuation observing process. In an example illustrated in FIG. 14, the high-speed data receiving circuit 10 starts the process on execution of the initial-phase adjusting process (Step S101 in FIG. 13) as a trigger.

First, the high-speed data receiving circuit 10 compares each piece of information acquired by the data sampling circuits A31, B33, C34, and E36 to G38 with information acquired by the data sampling circuit D35 (Step S201). Next, the high-speed data receiving circuit 10 determines whether all pieces of information acquired by the data sampling circuits A31, B33, C34, and E36 to G38 are consistent with the information acquired by the data sampling circuit D35 (Step S202). Namely, the high-speed data receiving circuit 10 determines whether all pieces of information acquired by the data sampling circuits A31 to G38 are consistent.

Then, when having determined that the all pieces of acquired information are not consistent (NO at Step S202), the high-speed data receiving circuit 10 determines whether respective pieces of information acquired by the data sampling circuits C34 to E36 are consistent (Step S203). Namely, the high-speed data receiving circuit 10 determines whether DQ#D0 to D3, which is a reference plane, is consistent with respective pieces of information acquired by the data sampling circuits C34 and E36.

When having determined that respective pieces of information acquired by the data sampling circuits C34 to E36 are consistent (YES at Step S203), the high-speed data receiving circuit 10 determines whether the information acquired by the reference plane fully matches either one of the preceding and subsequent sampling values (Step S204). Namely, the high-speed data receiving circuit 10 determines whether information acquired by the data sampling circuits A31 to C34 or E36 to G38 is consistent with DQ#D0 to D3.

Then, when having determined that the information acquired by the reference plane fully matches either one of the preceding and subsequent sampling values (YES at Step S204), the high-speed data receiving circuit 10 determines that the phase shift corresponds to "state 1" (Step S205). Furthermore, the high-speed data receiving circuit 10 calculates a phase correction amount (Step S206), and then ends the phase-fluctuation observing process.

Furthermore, when having determined that respective pieces of information acquired by the data sampling circuits C34 to E36 are not consistent (NO at Step S203), the high-speed data receiving circuit 10 determines that the phase shift corresponds to "state 2" (Step S207). Moreover, when having determined that the information acquired by the reference plane matches neither one of the preceding and subsequent sampling values (NO at Step S204), the high-speed data receiving circuit 10 determines that the phase shift corresponds to "state 2" (Step S207). After that, the high-speed data receiving circuit 10 ends the phase-fluctuation observing process.

Furthermore, when the all pieces of information acquired by the data sampling circuits A31 to G38 are consistent (YES at Step S202), the high-speed data receiving circuit 10 determines that the phase shift corresponds to "state 0" (Step S208). After that, the high-speed data receiving circuit 10 ends the phase-fluctuation observing process.

Effects of First Embodiment

As described above, the high-speed data receiving circuit 10 according to the first embodiment generates multiple clocks with different phases from one another, and acquires multiple data from a received DQ signal by using the different clocks, respectively. Furthermore, the high-speed data receiving circuit 10 determines whether the acquired data are consistent or not, and, when having determined that there is data inconsistent with the other data, corrects the phases of the generated clocks in a direction in which data inconsistency does not occur.

Consequently, the high-speed data receiving circuit 10 can properly acquire information from a data signal, such as a DQ signal. Namely, the high-speed data receiving circuit 10 acquires information from a received DQ signal by using clock signals having different phases from one another, and determines whether the acquired pieces of information are consistent or not, thereby detecting a phase shift. After that, when having detected a phase shift, the high-speed data receiving circuit 10 corrects the phases of the generated clocks in a direction in which the detected phase shift is eliminated, and therefore can properly acquire information even on the occurrence of different phase fluctuations in a DQS signal and a DQ signal.

Furthermore, the high-speed data receiving circuit 10 generates DQS_DLL#A to #G signals which are clocks with step-by-step different phases on the basis of a DQS signal, and acquires information from a DQ signal by using the generated DQS_DLL#A to #G signals. Moreover, the high-speed data receiving circuit 10 determines whether information acquired by using the reference DQS_DLL#D signal is consistent with information acquired by using the other DQS_DLL#A to #C and #E to #G signals.

Then, when there is information inconsistent with the reference information, the high-speed data receiving circuit 10 corrects the phases of DQS_DLL#A to #G in a direction opposite to the phase of a clock used in the acquisition of the inconsistent information on the basis of the phase of the DQS_DLL#D signal. Consequently, the high-speed data receiving circuit 10 can properly acquire information from a data signal, such as a DQ signal.

Namely, the high-speed data receiving circuit 10 acquires information by using multiple clocks with different phases from one another, and determines whether a information acquired by using the DQS_DLL#D signal is consistent with the other pieces of information, thereby detecting a phase shift between a DQS signal and a DQ signal. Then, the high-speed data receiving circuit 10 corrects the timing to acquire information according to the detected phase shift, and therefore can properly acquire information even on the occurrence of different phase fluctuations in a DQS signal and a DQ signal due to signal fluctuation caused by changes in operating environment, such as temperature and voltage, or the like.

Moreover, the high-speed data receiving circuit 10 can detect a phase fluctuation and correct the phases of the clocks before information acquire by the data sampling circuit D35, which is a reference plane, is affected by the phase fluctuation. Consequently, the high-speed data receiving circuit 10 can continuously acquire proper information. Furthermore, the high-speed data receiving circuit 10 can appropriately perform the phase correction while the high-speed data receiving circuit 10 is in operation, and therefore allows the construction of a highly-reliable system without suspension of the receiving process due to the execution of initial-phase correction during the operation.

Moreover, the high-speed data receiving circuit 10 generates multiple signals with step-by-step different phases from a received DQS signal by using the DLL circuit, and selects new DQS_DLL#A to #G signals from the generated signals on the basis of the magnitude and direction of phase shift. Consequently, the high-speed data receiving circuit 10 can immediately correct the phases of the DQS_DLL#A to #G signals, and, as a result, the high-speed data receiving circuit 10 can perform highly-reliable data reception even when frequencies of received DQ signal and DQS signal are high, and a data eye is narrow. Furthermore, the high-speed data receiving circuit 10 can eliminate the need for a complex circuit.

Moreover, the high-speed data receiving circuit 10 selects one of multiple signals output from the DLL circuit as a DQS_DLL#D signal which is a reference clock. Then, the high-speed data receiving circuit selects signals with phases ahead of that of the DQS_DLL#D signal as DQS_DLL#A to #C signals, and selects signals with phases behind that of the DQS_DLL#D signal as DQS_DLL#E to #G signals.

Consequently, the high-speed data receiving circuit 10 can detect a sign of phase fluctuation regardless of a direction of shift between the phase of a DQS signal and the phase of a DQ signal. As a result, the high-speed data receiving circuit 10 can correct the phases of the DQS_DLL#A to #G signals and continuously acquire proper information regardless of a direction of shift between the phase of a DQS signal and the phase of a DQ signal.

Furthermore, the high-speed data receiving circuit 10 counts the number of data sampling circuits which have acquired different information from that has been acquired by the data sampling circuit D35. Moreover, the high-speed data receiving circuit 10 determines the direction of a phase of a signal used by the data sampling circuit which has acquired the different information from that has been acquired by the data sampling circuit D35 on the basis of the phase of the DQS_DLL#D signal.

Then, the high-speed data receiving circuit 10 selects signals with phases shifted from those of the DQS_DLL#A to #G signals to a direction opposite to the determined phase direction by the same steps as the counted number as new DQS_DLL#A to #G signals.

Consequently, the high-speed data receiving circuit 10 can perform the appropriate phase correction. Namely, the high-speed data receiving circuit 10 corrects the phases of the DQS_DLL#A to #G signals according to an amount of phase shift, and therefore can keep the timing at which the data sampling circuits A31 to G38 acquire information within a range of data eye of the DQ signal.

Second Embodiment

The embodiment of the present invention is described above; however, the present invention can be embodied in various different forms besides the above-described embodiment. In what follows, there are described other embodiments included in the present invention as a second embodiment.
(1) Correction Method Upon detection of a phase shift, the above-described high-speed data receiving circuit 10 corrects the phases of DQS_DLL#A to #G signals by the same amount as an amount of the detected phase shift. However, the embodiment is not limited to this. For example, upon detection of a phase shift, the high-speed data receiving circuit 10 can select signals with phases different from those of the DQS_DLL#A to #G signals by half a cycle of a DQ signal in a direction opposite to the direction of the phase shift as new DQS_DLL#A to #G signals.

Figure 15:
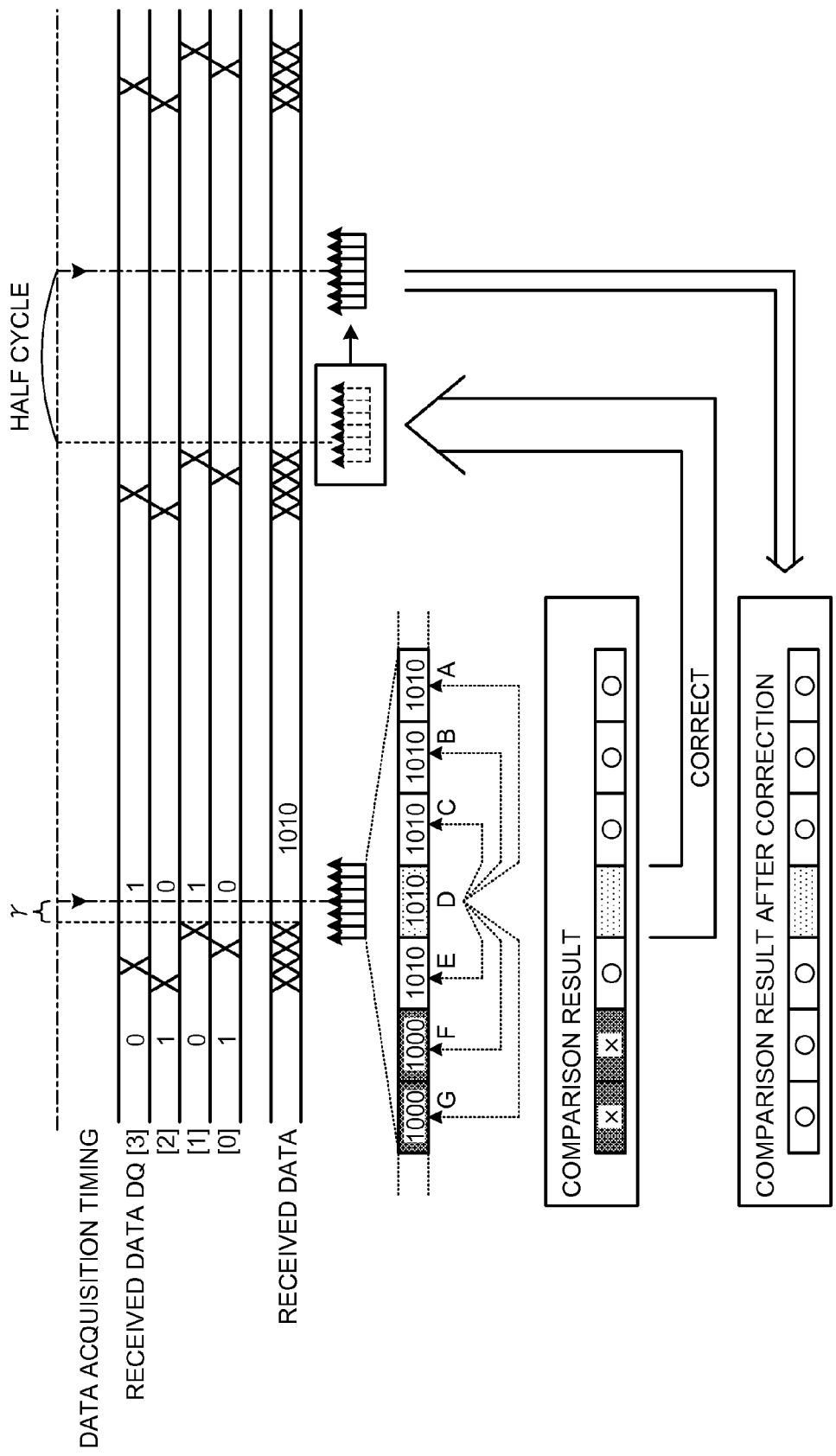
FIG. 15 is a diagram for explaining another example of the correction process.

For example, FIG. 15 is a diagram for explaining another example of the correction process. In the example illustrated in FIG. 15, the data sampling circuits F37 and G38 have acquired different information from that has been acquired by the data sampling circuit D35. In such a case, a high-speed data receiving circuit 10*a* according to the second embodiment can reselect the phases of the DQS_DLL#A to #G signals so as to set the phases ahead by half the phase of a DQ signal.

Specifically, in the initial-phase adjusting process, the high-speed data receiving circuit 10*a* determines a cycle of the timing at which information of a DQ signal is switched, and counts the number of DLYs for delaying the phase of a signal by half the determined cycle. Then, in the example illustrated in FIG. 15, the high-speed data receiving circuit 10*a* reselects a signal output from a DLY ahead of the signal selected as the DQS_DLL#D signal by the counted number as a new DQS_DLL#D signal.

Furthermore, when the data sampling circuits A31 and B33 have acquired different information from that has been acquired by the data sampling circuit D35, the high-speed data receiving circuit 10*a* reselects a signal output from a DLY behind by the counted number as a new DQS_DLL#D signal.

Namely, when different information from that has been acquired by the data sampling circuit D35 has been acquired by any of the data sampling circuits, it is considered that the timing to acquire information is close to the timing at which information of a DQ signal is switched as illustrated in γ in FIG. 15. Therefore, as illustrated in FIG. 15, upon detection of a phase shift, the high-speed data receiving circuit 10*a* reselects the phases of the DQS_DLL#A to #G signals so as to set the phases ahead by half the phase of a DQ signal in a direction opposite to the detected phase shift.

Consequently, the high-speed data receiving circuit 10*a* can reduce the number of corrections of the phases of DQS_DLL#A to #G. Furthermore, even when a phase difference among DQS_DLL#A to #G is small, the high-speed data receiving circuit 10*a* can perform the appropriate phase correction, and therefore can reduce the scale of the DLL circuit.

Moreover, even when a phase difference among DQS_DLL#A to #G is small, the high-speed data receiving circuit 10*a* can perform the appropriate phase correction; therefore, even when frequency of a DQ signal is high, the high-speed data receiving circuit 10*a* can acquire information within an appropriate range of data eye.
(2) Received Signals The above-described high-speed data receiving circuits 10 and 10*a* receive a DQ signal and a DQS signal, and acquire information from the DQ signal at the timing based on the received DQS signal. However, the embodiments are not limited to this; besides a protocol using a DQ signal and a DQS signal, a protocol using a signal in which data is stored and a signal indicating the timing at which the data has been stored can be arbitrarily applied.
(3) Clock-Phase Adjusting Circuit The above-described clock-phase adjusting circuit 20 generates multiple clock signals DQS_DLL#A to G with different phases on the basis of a received DQS signal. However, the embodiment is not limited to this.

For example, regardless of the phase of a DQS signal, the clock-phase adjusting circuit 20 just outputs multiple DQS_DLL#A to G signals having predetermined frequencies and delayed phases. Here, the phases of signals that the clock-phase adjusting circuit 20 first outputs are determined by the above-described initial-phase correcting process. After that, the clock-phase adjusting circuit 20 can correct the phases of the output signals on the basis of a phase correction signal notified by the phase-shift determining circuit 40.
(4) Data Sampling Circuits The above-described high-speed data receiving circuits 10 and 10*a* include the multiple data sampling circuits A31 to G38 which acquire information from a DQ signal. However, the embodiments are not limited to this; as long as the number of data sampling circuits is multiple, the high-speed data receiving circuits 10 and 10*a* can include any number of data sampling circuits.

Furthermore, the above-described high-speed data receiving circuits 10 and 10*a* determine whether DQ#D0 to D3 is consistent with information acquired by the other circuits with the data sampling circuit D35 as a reference plane. However, the embodiments are not limited to this; for example, the high-speed data receiving circuits 10 and 10*a* can set any data sampling circuit as a reference plane.

Moreover, in the above-described high-speed data receiving circuits 10 and 10*a*, the data sampling circuit D35 does not include a comparator. However, the embodiments are not limited to this. For example, the same circuit can be applied to all the data sampling circuits, and selected one of the circuits can be set as a reference plane.
(5) DLL Circuit The above-described high-speed data receiving circuits 10 and 10*a* generate multiple clocks DQS_DLL#A to #G with step-by-step different phases from a received DQS signal by using the DLL circuit. However, the embodiments are not limited to this; for example, the high-speed data receiving circuits 10 and 10*a* can generate DQS_DLL#A to #G on the basis of a received DQS signal by using any method to generate multiple clocks with step-by-step different phases.

(6) Program

Figure 16:
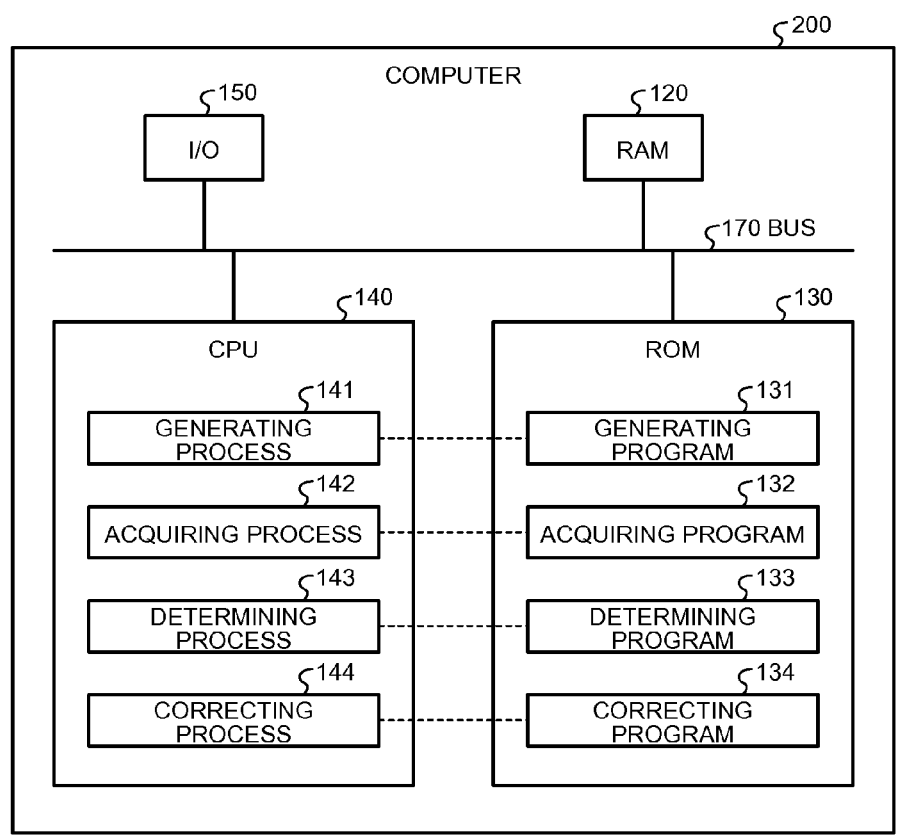
FIG. 16 is a diagram for explaining an example of a data receiving program.

There is described the case where the high-speed data receiving circuit 10 according to the first embodiment implements the various processes by using hardware. However, the embodiment is not limited to this, and the processes can be implemented by causing an information processing apparatus or I/O (Input Output) device control circuit which receives a data signal and a clock signal to execute a program prepared in advance. An example of a computer that executes a program having the same functions as the high-speed data receiving circuit described in the first embodiment is explained below with FIG. 16. FIG. 16 is a diagram for explaining an example of a data receiving program.

In a computer 200 illustrated in FIG. 16, a RAM (Random Access Memory) 120, a ROM (Read Only Memory) 130, and a CPU (Central Processing Unit) 140 are connected by a bus 170. An I/O 150 for receiving a data signal and a clock signal is further connected to the bus 170.

In the ROM 130, a generating program 131, an acquiring program 132, a determining program 133, and a correcting program 134 have been stored in advance. The CPU 140 reads out the programs 131 to 134 from the ROM 130 and executes the read programs, thereby, in the example illustrated in FIG. 16, the programs 131 to 134 serve as a generating process 141, an acquiring process 142, a determining process 143, and a correcting process 144. Incidentally, the processes 141 to 144 fulfill the same functions as the high-speed data receiving circuit 10 illustrated in FIG. 2.

Incidentally, the data receiving program described in the present embodiment can be realized by causing a computer, such as a personal computer or a workstation, to execute a program prepared in advance. This program can be distributed via a network, such as the Internet. Furthermore, this program is recorded on a computer-readable recording medium, such as a hard disk, a flexible disk (FD), a CD-ROM (Compact Disc Read Only Memory), an MO (Magneto Optic Disc), or a DVD (Digital Versatile Disc). Moreover, this program can be executed by being read out from a recording medium by a computer. Furthermore, this program can be executed as microcode to be executed on one-chip, such as an ASIC, an FPGA, or an SoC (System-on-a-chip).

According to one aspect, the technology disclosed in the present application properly acquires information from a data signal.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A data receiving circuit comprising:
a generating unit that generates a reference clock and multiple clocks with phases different from that of the reference clock step by step, the generating unit including;
a DLL (Delay Locked Loop) circuit that outputs multiple signals with phases which are changed from a phase of a received clock signal step by step; and
a selector that selects the reference clock and the multiple clocks from the multiple signals output from the DLL circuit, and outputs the selected signals,
a plurality of acquiring units that acquire data from a received data signal by using different clocks from one another out of the reference clock and the multiple clocks generated by the generating unit;
a determining unit that determines whether there is inconsistent data, among data acquired by using the multiple clocks, that is not equal to data acquired by using the reference clock; and
a correcting unit that, when the determining unit has determined that there is the inconsistent data, determines a direction of a phase of a clock used in acquisition of the inconsistent data based on the phase of the reference clock, counts a number of inconsistent data existing in the direction, and sends to the generating unit a phase correction signal indicating the number of inconsistent data and the direction,
wherein when having received the phase correction signal, the selector selects, as a new reference clock, a signal with a phase shifted from phase of a signal selected as the last reference clock by the same steps as the number indicated by the phase correction signal in a direction opposite to the direction indicated by the phase correction signal, and the multiple clocks.

2. The data receiving circuit according to claim 1, wherein the selector selects one signal from the multiple signals output from the DLL circuit as a reference clock, and selects multiple signals with phases ahead of phase of the reference clock and multiple signals with phases behind phase of the reference clock as clocks.

3. The data receiving circuit according to claim 1, wherein when having received the phase correction signal, the selector selects, as a new reference clock, a signal with a phase shifted from phase of a signal selected as the last reference clock by half a cycle of the data signal in a direction opposite to the direction indicated by the phase correction signal.

4. The data receiving circuit according to claim 1, wherein the generating unit generates a reference clock and multiple clocks with respective phases different from that of the reference clock and different from one another by a multiple of a predetermined phase,
the plurality of acquiring units acquire, within a period of the received clock signal, data from a received data signal by using different clocks from one another out of the reference clock and the multiple clocks generated by the generating unit, and
when having received the phase correction signal, the selector selects, as a new reference clock, a signal with a phase different from phase of a signal selected as the last reference clock by a phase obtained by multiplying the predetermined phase by a number indicated by the phase correction signal in a direction opposite to the direction indicated by the phase correction signal, and the multiple clocks.

5. An I/O (Input/Output) device control circuit comprising:
a high-speed data receiving circuit including:
a generating unit that generates a reference clock and multiple clocks with phases different from that of the reference clock step by step, the generating unit including;
a DLL (Delay Locked Loop) circuit that outputs multiple signals with phases which are changed from a phase of a received clock signal step by step; and a selector that selects the reference clock and the multiple clocks from the multiple signals output from the DLL circuit, and outputs the selected signals, a plurality of acquiring units that acquire data from a received data signal by using different clocks from one another out of the reference clock and the multiple clocks generated by the generating unit;

a determining unit that determines whether there is inconsistent data, among data acquired by using the multiple clocks, that is not equal to data acquired by using the reference clock; and a correcting unit that, when the determining unit has determined that there is the inconsistent data, determines a direction of a phase of a clock used in acquisition of the inconsistent data based on the phase of the reference clock, counts a number of inconsistent data existing in the direction, and sends to the generating unit a phase correction signal indicating the number of inconsistent data and the direction, wherein when having received the phase correction signal, the selector selects, as a new reference clock, a signal with a phase shifted from phase of a signal selected as the last reference clock by the same steps as the number indicated by the phase correction signal in a direction opposite to the direction indicated by the phase correction signal, and the multiple clocks.

6. A non-transitory computer readable storage medium having stored therein a data receiving program executed by a CPU (Central Processing Unit), the data receiving program causing the CPU to execute a process, the process comprising:

generating a reference clock and multiple clocks with phases different from that of the reference clock step by step, the generating including;

outputting, by a DLL (Delay Locked Loop) circuit, multiple signals with phases which are changed from a phase of a received clock signal step by step; and selecting the reference clock and the multiple clocks from the multiple signals output from the DLL circuit, and outputting the selected signals, acquiring multiple data from a received data signal by using different clocks out of the reference clock and the multiple clocks generated at the generating;

determining whether there is inconsistent data, among data acquired by using the multiple clocks, that is not equal to data acquired by using the reference clock; and determining, when it has been determined at the determining that there is the inconsistent data, a direction of a phase of a clock used in acquisition of the inconsistent data based on the phase of the reference clock, counting a number of inconsistent data existing in the direction, and sending a phase correction signal indicating the number of inconsistent data and the direction, wherein when having received the phase correction signal, the selecting includes selecting, as a new reference clock, a signal with a phase shifted from phase of a signal selected as the last reference clock by the same steps as the number indicated by the phase correction signal in a direction opposite to the direction indicated by the phase correction signal, and the multiple clocks.

7. A data receiving method performed by an information processing apparatus, the data receiving method comprising:

generating a reference clock and multiple clocks with phases different from that of the reference clock step by step, using a processor, the generating including;

outputting, by a DLL (Delay Locked Loop) circuit, multiple signals with phases which are changed from a phase of a received clock signal step by step; and selecting the reference clock and the multiple clocks from the multiple signals output from the DLL circuit, and outputting the selected signals, acquiring multiple data from a received data signal by using different clocks out of the reference clock and the multiple clocks generated at the generating, using the processor;

determining whether there is inconsistent data, among data acquired by using the multiple clocks, that is not equal to data acquired by using the reference clock, using the processor; and determining, when it has been determined at the determining that there is the inconsistent data, a direction of a phase of a clock used in acquisition of the inconsistent data based on the phase of the reference clock, counting a number of inconsistent data existing in the direction, and sending a phase correction signal indicating the number of inconsistent data and the direction, using the processor, wherein when having received the phase correction signal, the selecting includes selecting, as a new reference clock, a signal with a phase shifted from phase of a signal selected as the last reference clock by the same steps as the number indicated by the phase correction signal in a direction opposite to the direction indicated by the phase correction signal, and the multiple clocks.

* * * * *